US008367152B2

(12) United States Patent
Yokoyama et al.

(10) Patent No.: US 8,367,152 B2
(45) Date of Patent: Feb. 5, 2013

(54) MANUFACTURING METHOD OF LIGHT-EMITTING DEVICE

(75) Inventors: Kohei Yokoyama, Kanagawa (JP); Hisao Ikeda, Kanagawa (JP); Yosuke Sato, Kanagawa (JP); Tomoya Aoyama, Kanagawa (JP); Takahiro Ibe, Kanagawa (JP); Yoshiharu Hirakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1139 days.

(21) Appl. No.: 12/054,954

(22) Filed: Mar. 25, 2008

(65) Prior Publication Data

US 2008/0268135 A1 Oct. 30, 2008

(30) Foreign Application Priority Data

Apr. 27, 2007 (JP) ................. 2007-119084

(51) Int. Cl.
*B05D 5/12* (2006.01)
(52) U.S. Cl. ............... 427/64; 427/487; 427/66
(58) Field of Classification Search ............. 427/66, 427/64, 487
See application file for complete search history.

(56) References Cited

U.S. PATENT DOCUMENTS

| 5,518,824 | A | 5/1996 | Funhoff et al. |
| 5,688,551 | A | 11/1997 | Littman et al. |
| 5,937,272 | A | 8/1999 | Tang |
| 6,140,009 | A | 10/2000 | Wolk et al. |
| 6,242,152 | B1 | 6/2001 | Staral et al. |
| 6,699,597 | B2 | 3/2004 | Bellmann et al. |
| 6,855,384 | B1 | 2/2005 | Nirmal et al. |
| 7,090,890 | B1 | 8/2006 | Sturm et al. |
| 7,387,864 | B2 | 6/2008 | Felder et al. |
| 7,625,615 | B2 | 12/2009 | Kim et al. |

(Continued)

FOREIGN PATENT DOCUMENTS

| EP | 0 637 899 A1 | 2/1995 |
| EP | 0 851 714 A2 | 7/1998 |

(Continued)

OTHER PUBLICATIONS

Thin Films for Phase-shift masks; P.F. Carcia et al, Vacuum and Thin Films, Sep. 1999, 10 pgs.*

(Continued)

*Primary Examiner* — Joseph Del Sole
*Assistant Examiner* — Kimberly A Stewart
(74) *Attorney, Agent, or Firm* — Husch Blackwell LLP

(57) ABSTRACT

For a full-color flat panel display, demands for high definition, high aperture ratio and high reliability have been increasing. Therefore, increasing in the number of pixels and narrowing a pixel pitch have been major issues. According to the present invention, a layer including an organic compound is selectively formed with a light-exposure apparatus used in a photolithography technique without a resist mask. A material layer including a photopolymerization initiator, a material polymerized with the photopolymerization initiator, and an organic compound are formed on a plate, and then are exposed to light and selectively cured. A film-formation substrate is disposed so as to face the plate. The film-formation substrate or the material layer is heated so that the organic compound included in a region exposed to light or a region not exposed to light is evaporated to be selectively deposited on the surface of the film-formation substrate.

8 Claims, 11 Drawing Sheets

U.S. PATENT DOCUMENTS

| | | |
|---|---|---|
| 7,674,749 B2 | 3/2010 | Kang et al. |
| 7,691,783 B2 | 4/2010 | Matsuda et al. |
| 7,736,534 B2 | 6/2010 | Maxted et al. |
| 2004/0031442 A1 | 2/2004 | Yamazaki et al. |
| 2004/0209119 A1 | 10/2004 | Seo et al. |
| 2005/0012449 A1* | 1/2005 | Boroson et al. ............... 313/504 |
| 2006/0046181 A1* | 3/2006 | Kim et al. .................... 430/199 |
| 2006/0057423 A1* | 3/2006 | Steudel et al. ................ 428/690 |
| 2006/0233950 A1 | 10/2006 | Kim et al. |

FOREIGN PATENT DOCUMENTS

| | | |
|---|---|---|
| JP | 7-85973 | 3/1995 |
| JP | 7-114987 | 5/1995 |
| JP | 10-208881 | 8/1998 |
| JP | 11-8069 | 1/1999 |
| JP | 2005-158750 | 6/2005 |
| JP | 2005-519429 | 6/2005 |
| WO | WO 03/074628 A1 | 9/2003 |
| WO | WO 2006/045085 A1 | 4/2006 |

OTHER PUBLICATIONS

Hwang, C., "47.3: Plane Source and In-Line Deposition System for OLED Manufacturing," Society for Information Display, 2006 International Symposium Digest of Technical Papers, SID 06 Digest, vol. XXXVII, Book II, Jun. 7-9, 2006, pp. 1567-1570.

* cited by examiner

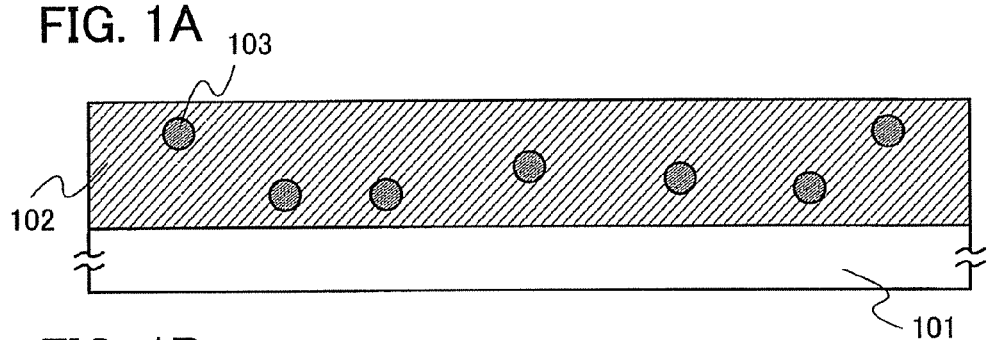
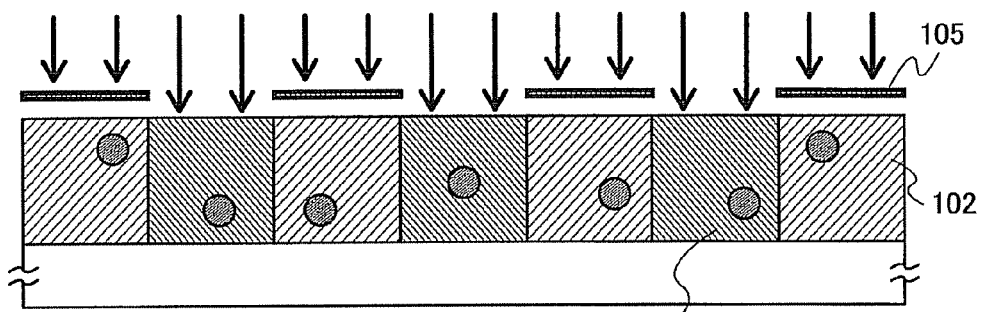
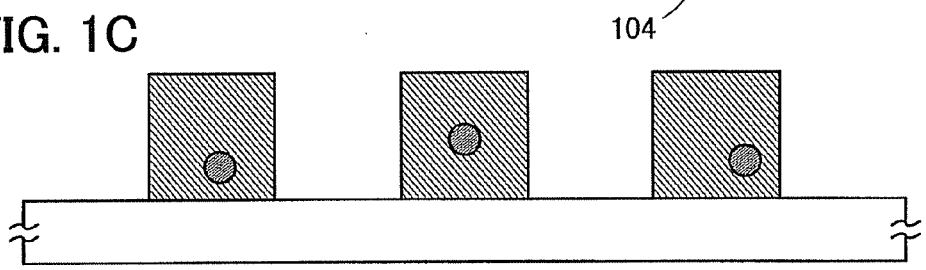
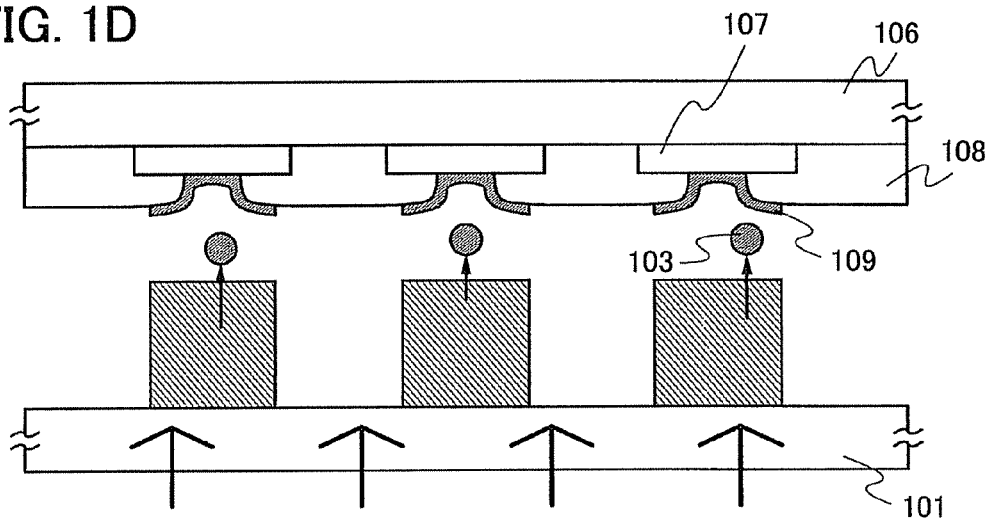

B-B' cross section

A-A' cross section

MANUFACTURING METHOD OF LIGHT-EMITTING DEVICE

BACKGROUND OF THE INVENTION

1. Field of the Invention

The present invention relates to a light-emitting device using a light-emitting element which can provide fluorescence or phosphorescence when an electric field is applied to the element in which a film including an organic compound (hereinafter also referred to as a layer including an organic compound) is provided between a pair of electrodes, and a manufacturing method thereof.

Note that the "light-emitting device" includes image display devices, light-emitting devices, and light sources (including illumination devices). In addition, a module in which a connector, for example, an FPC (Flexible Printed Circuit), TAB (Tape Automated Bonding) tape, or a TCP (Tape Carrier Package), is attached to a light-emitting device; a module in which a printed circuit board is provided ahead of a TAB tape or a TCP; and a module in which an integrated circuit (IC) is directly mounted on a light-emitting device by a COG (Chip On Glass) method are all included in the "light-emitting device". The present invention relates to a manufacturing method of a light-emitting device.

2. Description of the Related Art

In recent years, a light-emitting device having an EL element as a self-luminous light-emitting element has been actively developed. This light-emitting device is also called an organic EL display or an organic light-emitting diode. Such a light-emitting device has advantages in high response speed, low-voltage, low-power-consumption drive, and the like, which are suitable for displaying moving images; therefore, the light-emitting device has attracted attention as a next-generation display such as a new-generation mobile phone or portable information terminal (PDA).

An organic EL panel having an organic EL element is self-luminous type unlike a liquid crystal display device which needs a backlight, thus it is superior in visibility because high contrast can be easily realized and the viewing angle is wide. That is, the organic EL panel is more suitable for a display for outdoor use than a liquid crystal display, and a wide variety of applications thereof such as a display device of a mobile phone or a digital camera, or the like have been proposed.

In addition, an organic EL element means a light-emitting element including at least a cathode, an EL layer (a layer including an organic compound), and an anode, There are two types of the organic EL elements: a type where an EL layer is formed between two types of striped electrodes that are provided crosswise (passive matrix method); and a type where an EL layer is formed between a pixel electrode that is connected to a TFT and arranged in matrix, and an opposed electrode (active matrix method).

Further, an EL layer (a layer including an organic compound) has a stacked-layer structure typified by a stacked-layer structure of a hole-transporting layer, a light-emitting layer, and an electron-transporting layer. Further, EL materials for forming EL layers are roughly classified into low molecular (monomer) materials and high molecular (polymer) materials. As a film-formation method thereof, there are an evaporation method (including a vacuum evaporation method), a spin coating method, an inkjet method, a dipping method, an electropolymerization method, and the like.

For a full-color flat panel display, demands for high definition, high aperture ratio and high reliability have been increasing. Such demands are major issues in improving high definition (increase in the number of pixels) and miniaturization of a pixel pitch along with downsize of a light-emitting device. At the same time, there are increasing demands for increase of productivity and cost reduction.

When considering the manufacture of a full-color flat panel display using organic EL elements which emit red, green and blue respectively, high precision positional alignment for deposition is not provided by any deposition method, and thus the interval between pixels which emit different colors from each other is designed to be wide.

As a selective deposition method, Reference 1 discloses a manufacturing method of an organic light-emitting element which employs a donor film for an organic thin film and laser light (Reference 1: Japanese Published Patent Application No. H 10-208881).

SUMMARY OF THE INVENTION

There are strict limitations to distribution and variations of thicknesses of layers including an organic compound used for organic EL elements. Further, there is a possibility that characteristics of the layers including an organic compound may deteriorate due to impurities such as moisture when they are exposed to the air.

Therefore, because the thickness of a layer including an organic compound used for an organic EL element is small, it is difficult to use a method in which a photoresist having a desired pattern formed by light exposure and development is formed over such a layer including an organic compound, and then the layer including an organic compound is selectively etched using the formed photoresist as a mask.

In view of the above problems, according to the present invention, a resist mask is not formed, and a layer including an organic compound is selectively formed with a light-exposure apparatus used in a photolithography technique.

A first substrate over which a first electrode is formed in advance is prepared first. Then, a material layer including a photopolymerization initiator, a material polymerized with the photopolymerization initiator, and an organic compound are formed over a second substrate (also referred to as a plate), next, the second substrate is exposed to light by a light-exposure apparatus and selectively cured. The second substrate is arranged with respect to the first substrate such that the substrates face each other. The second substrate or the material layer is heated by a heat source so that the organic compound included in a region which is exposed to light or a region which is not exposed to light is evaporated to be selectively deposited on the surface of the first substrate facing the second substrate.

The present invention solves at least one of the above problems.

Resolution performance of a light-exposure apparatus used in a photolithography technique depends on a wavelength of a light source and performance of a projection lens (NA). Note that "NA" is a numerical aperture of a projection lens. The wavelength of a light source can be g line (436 nm), i line (365 nm), KrF excimer laser (248 nm), Ar excimer laser (193 nm), F2 laser (157 nM), Extreme Ultra Violet (13.5 nm), or the like, and a high resolution light exposure of the smallest line width which is 100 nm or less is possible.

According to the present invention, a positional alignment for selective deposition can be enhanced and the interval between pixels emitting different colors can be designed to be narrow, and accordingly still higher definition can be realized in a full-color display device.

In addition, a light-exposure apparatus used in electron beam projection lithography using a stencil mask or a membrane mask can also be used.

As a light-exposure apparatus, a light-exposure mask using a reversible and selective light-transmitting material of a liquid crystal may be used. If such a liquid crystal shutter is used for a light-exposure apparatus, fabrication cost and fabrication time of a mask can be reduced. Further, a light-exposure apparatus using a micromirror array or a digital mirror device (DMD) may be used. If such a mirror array is used for a light-exposure apparatus, fabrication cost and fabrication time of a mask can be reduced.

The photopolymerization initiator is one component of a photocurable composition, and polymerizes a composition by irradiation with an ultraviolet ray, an electron beam, or the like, or forms a high molecular material. Note that the high molecular material is a substance with covalent bonds of several hundreds or several tens of thousands of one type or plural types of relatively simple molecules. The photopolymerization initiator is broadly classified into three types: a first type is a substance which generates a radical by irradiation with an ultraviolet ray, an electro beam or the like, and then polymerization occurs due to the radical; a second type is a photo-acid-generating agent which generates a cation; and a third type is a photobase generator which generates an anion. The present invention may employ any type of a photopolymerization initiator of the three types.

In addition, change from a liquid state to a solid state by light energy is called photocuring and a synthetic organic material to be cured is called a photocurable resin. The photocurable resin is a kind of monomers, oligomers, photopolymerization initiators or photocurable compositions including an additive. The monomer is an organic material of a large molecule obtained by polymerization. The oligomer is an organic material of a large molecule obtained by reacting some monomers in advance and large molecule obtained by polymerization, similarly to the monomer. The monomer or oligomer is not easily polymerized, and thus a polymerization initiator is mixed in the monomer or oligomer so that a reaction starts.

The photocuring composition is cured by the following steps. The photopolymerization initiator is activated by absorbing light and produces a radical, a cation or an anion. The produced radical, cation, or anion is reacted with an oligomer or a monomer, so that three-dimensional polymerization or a crosslinking reaction occurs. When a molecule which is larger than a certain level is obtained by the reaction, a portion irradiated with light is changed from a liquid state to a solid state. An additive such as a stabilizer or a filler is included in order to stabilize or reinforce the photocurable composition.

In addition, in a case where a resin layer including an organic compound and a photopolymerization initiator is formed on the second substrate, etching is conducted using a light-exposure mask such that a photocured region is left, and the second substrate or the region layer is heated, thus the resin layer is left on the second substrate, and the organic compound included in the resin layer is formed over the first substrate.

A structure of the present invention disclosed in this specification is a manufacturing method of a light-emitting device, comprising the steps of: forming a first electrode on a first substrate; forming a first layer including a photopolymerization initiator, a material to be polymerized with the photopolymerization initiator, and an organic compound on a second substrate; selectively exposing the first layer to light and developing the first layer; making the a surface of the first substrate on which the first electrode is formed and a surface of the second substrate on which the first layer is formed to face each other; heating the developed first layer to evaporate the organic compound included in the first layer so that a second layer including the organic compound is selectively formed on the first electrode; and forming a second electrode on the second layer.

In addition, a plurality of organic compounds are included in the first layer and deposition is conducted, so that a layer including the plurality of organic compounds can be formed on a substrate to be provided with a film (also referred to as a film-formation substrate).

Further, another structure of the present invention disclosed in this specification is a manufacturing method of a light-emitting device, comprising the steps of: forming a first electrode on a first substrate; forming a first layer including a photopolymerization initiator, a material to be polymerized with the photopolymerization initiator, and a first organic compound and a second organic compound on a second substrate; selectively exposing the first layer to light and developing the first layer; making the a surface of the first substrate on which the first electrode is formed and a surface of the second substrate on which the first layer is formed to face each other; heating the developed first layer to evaporate the first organic compound and the second organic compound included in the first layer so that a second layer including the first organic compound and the second organic compound is selectively formed on the first electrode; and forming a second electrode on the second layer.

When co-deposition is conducted using a conventional evaporation apparatus, a guest material and a host material having a different sublimation temperature from each other are put in different crucibles, and the thickness rate of co-deposition is adjusted by use of a thickness monitor till the thickness rate is stable. Thus, it takes extra time to start the co-deposition and further setting of a complex condition is needed. On the other hand, according to a deposition method of the present invention, if a material layer previously obtained by mixture at a desired mixture ratio is formed over a second substrate to have an even thickness by a spin coating method or the like, deposition of the material can be conducted with the mixture ratio of the material layer formed on the second substrate, without using the thickness monitor. Further, of course, by using the deposition method according to the present invention, deposition of the material can be finished in short time with highly even thickness.

In addition, in a case where a material layer including a monomer of an organic compound and a photopolymerization initiator is formed over the second substrate, since the monomer of the organic compound in a region exposed with a light-exposure mask is polymerized, the monomer of the organic compound in an unexposed region (a region which is not exposed to light) flies upward to the first substrate, so that the monomer is deposited on the first substrate when the second substrate or the material layer is heated. As a result, the polymer of the organic compound in the light exposed region is left on the second substrate.

Further, another structure of the present invention disclosed in this specification is a manufacturing method of a light-emitting device, comprising the steps of: forming a first electrode on a first substrate; forming a first layer including a photopolymerization initiator, and an organic compound on a second substrate; selectively exposing the first layer to light so that a light-exposed region of the first layer is polymerized; making the a surface of the first substrate on which the first electrode is formed and a surface of the second substrate on which the first layer is formed to face each other; heating the first layer to evaporate the organic compound included in a region other than the light-exposed region of the first layer so that a second layer including the organic compound is selectively formed on the first electrode; and forming a second electrode on the second layer.

The organic compound may be included not only in a negative type material of which a portion exposed to light is left, but also in a positive type material of which a portion exposed to light is soluble in an etchant. For example, if an organic compound which is sensitive to exposing light is used, it is effective that the organic compound is included in a positive type material.

Further, an attenuated phase shift mask (or a half tone phase shift mask) can also be used. If an attenuated phase shift mask is used, light exposure at different depths can be conducted to different regions. Layers having different thicknesses can be formed in different regions by a single deposition process. In formation of a full-color flat panel display, an optical design suitable for each emission color is different and thus different optical design for each emission color should be employed. For example, an attenuated phase shift mask is used to conduct light-exposure treatment at different depths to different regions so as to form hole-transporting layers selectively, so that the thicknesses of the hole-transporting layers are different in accordance with each of light emitting elements having different emission colors.

In addition, an evaporation mask can be combined. The evaporation mask has an opening, and thus the shape of the opening is set in a limited way. A pattern having an island-shape region surrounded by an opening region, for example, an evaporation mask having a ring-shaped opening is difficult to form. The present invention uses light exposure and thus can realize formation of a variety of patterns. By combining with an evaporation mask, it is possible that deposition is done only in a desired region (deposition is not conducted in the other region than the desired region). In addition, the amount of the organic compound attached to the evaporation mask can be reduced more than that of a conventional evaporation apparatus, and the frequency of cleaning the mask can be reduced.

Moreover, a deposition apparatus used for deposition in the present invention will now be described.

A deposition apparatus of the present invention includes, in a vacuum chamber of which pressure can be reduced, at least a plate on which a material layer is formed, a film-formation substrate, and a heat source (e.g., a hot plate, a flash lamp). The plate on which a material layer is formed and the film-formation substrate are disposed to face each other. The plate and the film-formation substrate are set such that a material layer surface and a surface (formation surface) of the film-formation substrate, on which the material layer is to be formed, face each other. Further, the deposition apparatus has a mechanism to adjust the arrangement so that a distance d between the material layer surface and the formation surface is at most 100 mm, preferably less than or equal to 0.05 mm. It is to be noted that the material layer surface and the formation surface are preferably disposed parallel to each other.

As for the distance d, in a case where unevenness exist due to wirings or partition layers on a film-formation substrate, the distance d is defined as a distance between the surface of a plate on which a material layer formed, and the outermost surface of a film-formation substrate, i.e., the most projected portion in an exposed surface.

There is no particular limitation on the plate as long as it is flat, and quartz, glass, metal or the like can be used. If a conductive substrate is used as the plate, the plate can be used as a heat source and electric current can be directly supplied to the conductive substrate for heating.

The pressure is reduced in the deposition chamber, the plate is rapidly heated by heat conduction or heat radiation using the heat source, the material layer on the plate is evaporated in a short time to be deposited on the film-formation substrate, and thus the material layer is formed.

If light exposure with high precision is conducted, a quartz substrate having high planarity is preferably used. When the material layer is selectively exposed to light, light exposure may be conducted at the surface of the plate provided with the material layer or the back of the plate. Naturally, a light-transmitting substrate is used as the plate when the light exposure is conducted at the back of the plate.

The deposition apparatus used in the present invention can greatly increase use efficiency and throughput of an evaporation material, as compared with a conventional evaporation apparatus.

A conventional evaporation apparatus includes a substrate that is set on a substrate holder; a crucible (or an evaporation boat) in which an EL material, that is, an evaporation material is put and sealed; a shutter to prevent the rising of a sublimating EL material; and a heater to heat the EL material in the crucible. Then, the EL material heated by the heater sublimates to form a film on a rotating substrate. At this time, the distance between the rotating substrate and the crucible is needed to be 1 meter or longer for uniform deposition. The larger the size of the rotating substrate is, the more amount of EL material is needed. As in a conventional evaporation apparatus, in a case where the distance between a substrate and an evaporation source is set 1 meter or longer, and the use efficiency of an expensive EL material is extremely low, about 1% or less, a large amount of EL material is prepared in a large crucible (or evaporation boat). In addition, heating time of the large amount of EL material stored in the large crucible till the evaporation rate becomes stable is increased, and thus decrease of throughput of the evaporation is caused. Further, it takes time to cool down the EL material. In particular, a substance is not easily heated and cooled in vacuum. In a case where the large amount of EL material is put in plural crucibles, it is difficult to control evaporation rates of the materials stored in the plural crucibles and to keep the thickness of a deposited film even.

In such a conventional evaporation apparatus, an evaporation mask is used for selective deposition and the accuracy of the deposition positional alignment depends on the processing accuracy of the mask, and thus micro fabrication with several tens of micrometers is difficult.

A deposition apparatus used in the present invention depends on the accuracy of a light-exposure mask, and thus micro fabrication with several tens of micrometers is possible. Accordingly, still higher resolution can be realized for a full-color display device.

Reference 1 discloses a technique in which a layer including an organic compound is selectively formed, and at least a base film having a light-transmitting property, a light absorption layer and a transfer layer are included, and selective deposition is done by laser scanning.

In the technique disclosed in Reference 1, for laser irradiation, a laser light source, an optical system for forming a laser beam shape on an irradiation surface, and a space for the optical path of the laser light are needed. Moreover, a mechanism and deposition time for laser scanning are also needed. For example, when a large size substrate having 1 meter or longer on one side is used, deposition time is increased as a region to be scanned with laser light is expanded. Accordingly, when a large size substrate is used, this leads to an increase in the size of a deposition apparatus and an extension in the deposition time. In addition, the laser light source is an expensive consumable product and the cost is increased since it needs to be exchanged for maintenance.

The deposition apparatus used in the present invention can be decreased in its size even when a large substrate is used, for example, substrates having sizes of 320 mm×400 mm, 370 mm×470 mm, 550 mm×650 mm, 600 mm×720 mm, 680 mm×880 mm, 1000 mm×1200 mm, 1100 mm×1250 mm, and 1150 mm×1300 mm, unlike a conventional evaporation apparatus, and can provide deposition in a short time and an even thickness. In addition, the heat source (such as a hot plate, a flash lamp or the like) used in the present invention can cope with the increase of the substrate size and is suitable for heating a large size substrate. Further, in a case where the plate itself is used as a heat source by electrical conduction, it can cope with the increase of the substrate size and is suitable for heating a large size substrate.

Note that there is no particular limitation in a case where deposition to a large size substrate is not conducted, as long as an apparatus used can selectively deposit a film including an organic compound on a film-formation substrate, when a substrate provided with a material layer including an organic compound is used as an evaporation source, and the substrate is made to face the film-formation substrate. For example, a tape provided with a material layer may be used in a roll-to-roll deposition system.

Although deposition time is longer compared to a hot plate which can heat the entire surface of a substrate, it is possible that a stick heater may be scanned to heat a plate provided with a material layer so that selective deposition can be done on a substrate to be processed. In addition, if the increase in the size of a deposition apparatus and extension of deposition time are not concerned, scanning of laser light may be conducted for heating. Since the present invention relates to a deposition method in which deposition is conducted using a material layer which is partially exposed to light by using a light-exposure apparatus, a deposition apparatus is not especially limited, as long as selective deposition to the film-formation substrate is possible.

According to the deposition method of the present invention, a film thickness monitor is not used, and the accuracy of a positional alignment for selective deposition can be improved more than a conventional deposition method. Moreover, even when a large size substrate is used, the uniformity in thickness is high and deposition in a short time can be conducted.

In the deposition method of the present invention, a region evaporated by a heat source or the amount of a material to be evaporated is small, and thus attachment of the evaporated material to the inner wall of a deposition chamber can be suppressed. Accordingly, the frequency of cleaning the deposition chamber can be reduced.

BRIEF DESCRIPTION OF THE DRAWINGS

In the accompanying drawings:
FIGS. 1A to 1D are cross-sectional views illustrating a manufacturing method of a light-emitting device described in Embodiment Mode 1.

DETAILED DESCRIPTION OF THE INVENTION

Figure 2A:
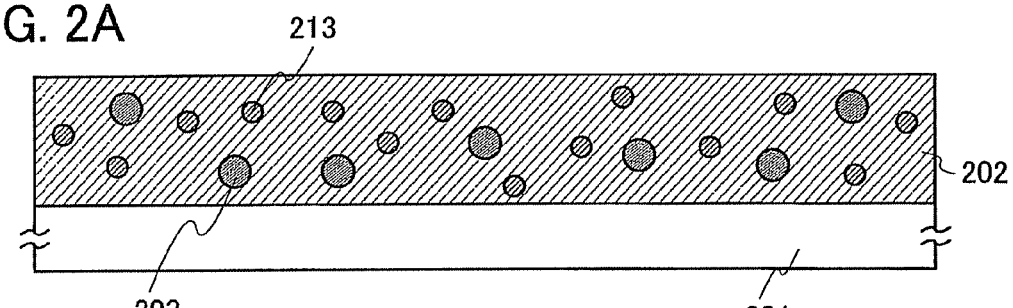
FIGS. 2A to 2D are cross-sectional views illustrating a manufacturing method of a light-emitting device described in Embodiment Mode 2.

Embodiment Modes
Embodiment Modes of the present invention will now be described.
(Embodiment Mode 1)
A manufacturing method of a light-emitting device is described with reference to FIG. 1A to FIG. 1D.

A first substrate 106 and a second substrate 101 are prepared first. The first substrate 106 is a substrate to be provided with a light-emitting element, and the second substrate 101 is a substrate used for forming a second layer including an organic compound over the first substrate 106 (the second substrate 101 is also referred to as a plate). As the second substrate 101, a substrate having a light-transmitting property can be used.

On the second substrate 101, an application liquid, i.e., a liquid in which an organic compound 103 (or a precursor of the organic compound 103) is dissolved or dispersed in a solvent is applied by a wet process, e.g., a spin coating method, a spray coating method, a dip coating method or the like. The organic compound 103 is preferably soluble or dispersible in the solvent. The thickness and uniformity of the second layer to be formed over a first substrate 106 in a later step depends on the adjustment of the application liquid. Therefore, it is important that the organic compound 103 is evenly dissolved in the application liquid, or is evenly dispersed in the application liquid. In addition, when a spin coating method is employed, the thickness of a film formed can be controlled by the viscosity of application liquid or the number of rotation of the substrate.

The first layer 102 including the organic compound 103 is made to include a photopolymerization initiator and a composition that reacts with the photoactivated photopolymerization initiator to form a resin. A schematic view of a cross-sectional structure of the second substrate 101 at this stage is illustrated in FIG. 1A.

As the solvent, a polar solvent or a non-polar solvent is used. As the polar solvent, lower alcohol such as water, methanol, ethanol, n-propanol, i-propanol, n-butanol, or sec-butanol, and further THF, acetonitrile, dichloromethane, dichloroethane, anisole, and the like are given, and a mixture of plural kinds of the above substances may be used. As the non-polar solvent, hexane, benzene, toluene, chloroform, ethyl acetate, tetrahydrofuran, methylene chloride, and the like are given, and a mixture of plural kinds of the above substances may be used.

The organic compound 103 may be selected from substances described below, depending on a solvent used. For example, in order to obtain red light emission, substances that can emit light with a peak of emission spectrum in 600 to 680 nm, can be used as a light-emitting substance. For example, 4-dicyanomethylene-2-isopropyl-6-[2-(1,1,7,7-tetramethyl-julolidin-9-yl)ethenyl]-4H-pyran (abbreviation DCJTI);

4-dicyanomethylene-2-methyl-6-[2-(1,1,7,7-tetramethylju-lolidin-9-yl)ethenyl]-4H-pyra n (abbreviation DCJT); 4-di-cyanomethylene-2-tert-butyl-6-[2-(1,1,7,7-tetramethyljulo-lidin-9-yl)ethenyl]-4H-py ran (abbreviation: DCJTB); periflanthene; 2,5-dicyano-1,4-bis[2-(10-methoxy-1,1,7,7-tetramethyljulolidin-9-yl)ethenyl]benzene and the like can be used.

In order to obtain greenish light emission, substances that can emit light with a peak of emission spectrum in 500 to 550 nm can be used as a light-emitting substance. For example, N,N'-dimethylquinacridon (abbreviation: DMQd), coumarin 6, coumarin 545T, tris(8-quinolinolate)aluminum (abbreviation: Alq$_3$) and the like can be employed.

In order to obtain bluish light emission, a peak of emission spectrum in 420 to 500 nm can be used as a light-emitting substance. For example, 9,10-bis(2-naphthyl)-2-tert-butylan-thracene (abbreviation: t-BuDNA); 9,9'-bianthryl; 9,10-diphenylanthracene (abbreviation: DPA); 9,10-bis(2-naph-thyl)anthracene (abbreviation: DNA); bis(2-methyl-8-quinolinolato)-4-phenylphenolato-gallium (abbreviation: BGaq); bis(2-methyl-8-quinolinolato)-4-phenylphenolato-aluminum (abbreviation: BAlq); and the like can be used.

There is no particular limitation on a substance to be used with a light-emitting substance so as to disperse the light-emitting substance, for example, an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a metal complex such as bis[2-(2-hydroxyphenyl)pyridinato]zinc (abbreviation: Znpp$_2$) and bis[2-(2-hydroxyphenyl)benzoxazolato]zinc (abbreviation ZnBOX); and the like can be used.

Next, selective light exposure is conducted with a light-exposure apparatus. FIG. 1B illustrates a mode in which light exposure is conducted using a light-exposure mask 105. A region with a desired shape is selectively exposed to light using the light-exposure mask 105. In a light-exposed region 104, polymerization reaction is produced. Although FIG. 1B illustrates the example in which light exposure is conducted at a face of the first layer 102 including an organic compound formed, that is, the surface, it is not particularly limited to this. If a second substrate has a light-transmitting property, light exposure may be conducted at the back of the second substrate with a light-exposure mask provided on the back side.

Next, development is conducted. FIG. 1C illustrates a mode after the other region than the light-exposed region is removed by a developer. The light-exposed region 104 has a state in which a polymerization reaction occurs and the organic compound 103 is surrounded by a resin, and the organic compound is not in direct contact with the developer. Thus, even when a developer of an alkyl water solution or the like is used, the organic compound 103 included in the light-exposed region 104 is not reacted with water. Note that there is no particular limitation on the developer, and an etchant which can remove a region which is not exposed to light and leave the light-exposed region is used.

Then, in order to remove moisture or the solvent attached to the second substrate, heat treatment, e.g., vacuum annealing, is preferably conducted. In addition, in order to remove moisture attached to the first substrate, heat treatment, e.g., vacuum annealing, is preferably conducted.

Next, the first substrate and the second substrate are transferred to one deposition chamber. The film-formation chamber includes at least a plate on which a material layer is deposited, a film-formation substrate, and a heat source (such as a hot plate, a flash lamp or the like) in a vacuum chamber of which at least pressure can be reduced.

Next, the first substrate 106 and the second substrate 101 are disposed so as to face each other, the distance d between the substrate is fixed and the positions of the substrates are aligned. In advance, over the first substrate 106, a first electrode 107 and an insulator 108 for preventing short-circuiting between adjacent first electrodes are provided. In addition, the distance d between the substrates is from 0 mm to 30 mm, inclusive, preferably from 0 mm to 10 mm. Note that the case where the distance between the substrates is 0 mm means a state in which the surfaces of the first substrate and the second substrate are in contact with each other; however, when unevenness of the insulator 108 exists on the first substrate 106, a top portion of the unevenness of the insulator 108 is in contact with the material layer formed on the second substrate, and there is actually a space between the first electrode and the material layer formed on the second substrate. Accordingly, even when the surfaces of the first substrate and the second substrate are partially in contact with each other, the interval between the substrates is present and the state is referred to as that the distance d between the substrates is 0 mm.

Next, the second substrate 101 is irradiated with a flash lamp under reduced pressure so that the second substrate 201 or the light-exposed region 104 is heated. Then, as illustrated in FIG. 1D, the organic compound 103 included in the light-exposed region 104 flies upward and attaches to the first electrode 107, so that a second layer 109 including an organic compound is selectively formed. Note that the organic compound 103 is evaporated by heating, but since the light-exposed region 104 is polymerized, the other composition than the organic compound 103, i.e., a high molecular material such as resin is left. As illustrated in FIG. 1D, since the amount of the organic compound to fly upward is limited in advance, the layer including an organic compound with a desired thickness can be formed in a desired region, without using a thickness monitor.

In FIG. 1D, the insulator 108 serving as a partition is provided to prevent short-circuiting between adjacent first electrodes, but this is not a limiting example and the insulator 108 is not necessarily provided. In addition, in FIG. 1D, the first substrate is disposed on the upper side and the second substrate is disposed on the lower side, but this is not a limiting example, and it is also possible that the substrates are arranged vertically so as to face each other.

Further, it is also possible that a plurality of plates serving as second substrates are prepared, different material layers are formed on the plates, and the above deposition procedure is repeated to selectively form a stacked layer.

In a conventional technique, when formation of a stacked layer by a coating method using a liquid is attempted, a first layer is formed using a first solvent and then a second layer is formed using a second solvent different from the first solvent; therefore, there is a limitation to the types of materials which can be selected. If the second layer is formed using the same solvent as the first solvent, dissolving of the first layer is a concern. In addition, due to the unevenness of the substrate caused by the first electrode and wiring, it is difficult to form a film with an uniform thickness.

In the deposition method of the present invention, a film is formed on the first electrode provided on the first substrate, using a layer formed on the flat second substrate by a coating method. Thus, even if unevenness exists on the surface of the first substrate, a uniform thickness can be obtained.

When the first substrate and the second substrate are arranged to face each other, a mask having an opening may be disposed between the substrates. It is difficult to form a highly precise opening with this mask, but the mask may be used as a mask for securely preventing deposition on a connection portion or the like to an external terminal. Further, the amount of a material to be deposited is limited and thus the amount of the material attached to the evaporation mask can be reduced.

Next, a second electrode is formed to be superposed above the first electrode, thereby forming a light-emitting element. The light-emitting element includes at least the first electrode, the layer including an organic compound, and the second electrode, and the layer including an organic compound is disposed between the first electrode and the second electrode.

In this embodiment mode, the example of using a flash lamp is described, but this is not a limiting example and a hot plate having a larger area than the second substrate can be used. In addition, when a substrate having electric conductivity (e.g., a tungsten substrate or a copper substrate) is used as the second substrate, the second substrate can be used as a heat source and electric current is directly supplied to the substrate having electric conductibility for heating.

(Embodiment Mode 2)

Plural types of organic compounds can be used, although Embodiment Mode 1 has described the example in which one type of organic compound is used. Embodiment Mode 2 will describe an example in which co-deposition is conducted using plural types of organic compounds.

A first substrate 206 and a second substrate 201 are prepared first. The first substrate 206 is a substrate to be provided with a light-emitting element, and the second substrate 201 is a substrate used for forming a second layer 210 including plural types of organic compounds over the first substrate 206. As the second substrate 201, a quartz substrate, a glass substrate, a ceramic substrate, a metal substrate or the like can be used.

On the second substrate 201, an application liquid, i.e., a liquid in which a first organic compound 203 (or a precursor of the organic compound 203) and a second organic compound 213 (or a precursor of the organic compound 203) is dissolved or dispersed in a solvent is applied by a wet process, e.g., a spin coating method, a spray coating method, a dip coating method or the like. The first organic compound 203 and the second organic compound 213 are preferably soluble or dispersible in the solvent. The thickness and uniformity of the second layer to be formed over the first substrate 206 in a later step, and the existence ratio (also referred to as a mixture ratio) of the plural types of organic compounds included in the second layer depend on the adjustment of the application liquid. Therefore, it is important that the mixture ratio of the first organic compound 203 to the second organic compound 213 is adjusted, and first organic compound 203 and the second organic compound 213 are evenly dissolved in the application liquid, or is evenly dispersed in the application liquid. In addition, when a spin coating method is employed, the thickness of a film formed can be controlled by the viscosity of application liquid or the number of rotation of the substrate Note that the first layer 202 including the plural types of organic compounds (the first organic compound 203 and the second organic compound 213) include a photopolymerization initiator and a composition which is reacted with an activated photopolymerization initiator to form a resin. FIG. 2A is a schematic view of a cross-sectional structure of the second substrate 201 at this stage.

As the solvent, a polar solvent or a non-polar solvent described in Embodiment Mode 1 is used.

The first organic compound 203 and the second organic compound 213 may be selected as appropriate for a solvent to be used, among the light-emitting substances described in Embodiment Mode 1. In addition, the sublimation temperature of the first organic compound 203 may be different from that of the second organic compound 213. Note that in a later heat treatment, the heating temperature may be set in accordance with the higher sublimation temperature of the first and the second organic compounds.

Figure 2B:
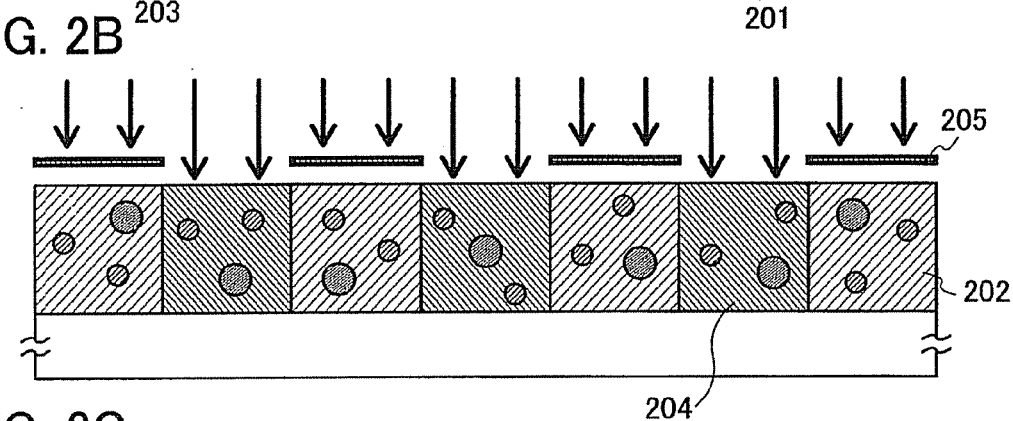

Next, selective light exposure is conducted with a light-exposure apparatus. FIG. 2B illustrates a mode in which light exposure is conducted using a light-exposure mask 205. By using the light-exposure mask, a region having a desired shape can be selectively exposed to light. In the light-exposed 204, a polymerization reaction occurs. Although FIG. 2B illustrates the example in which light exposure is conducted at the face in which the first layer 202 including plural types of organic compound formed, that is, from the surface, this is not a limiting example. If the second substrate has a light-transmitting property, a light-exposure mask may be provided on the back of the second substrate, and light exposure may be conducted at the back of the second substrate.

Figure 2C:
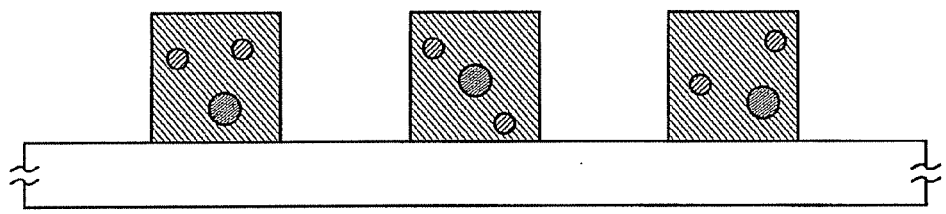

Next, development is conducted. FIG. 2C illustrates a mode after the other region than the light-exposed region is removed by a developer. The light-exposed region 204 has a state in which a polymerization reaction occurs and the first organic compound 203 and the second organic compound 213 are surrounded by a resin, and the organic compound is not in a direct contact with the developer. Thus, even if a developer of an alkyl water solution or the like is used, the first organic compound 203 and the second organic compound 213 included in the light-exposed region 204 are not reacted with water. Note that there is no particular limitation on the developer, and an etchant which can remove a region which is not exposed to light and leave the light-exposed region is used.

Next, the first substrate 206 and the second substrate 201 are disposed so as to face each other, the distance d between the substrates is fixed and the positions of the substrates are adjusted. In advance, over the first substrate 206, a first electrode 207 and an insulator 208 for preventing short-circuiting between adjacent first electrodes are provided. In addition, the distance d between the substrates is from 0 mm to 30 mm, inclusive.

Figure 2D:
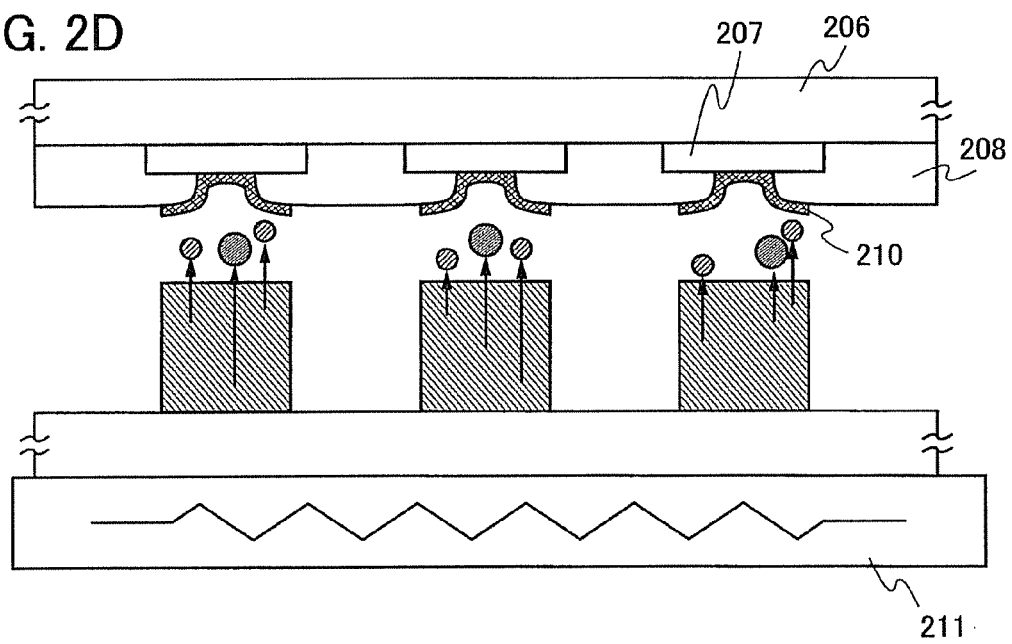

Next, a hot plate 211 which has been heated in advance is moved close to the second substrate 201 under a reduced pressure so that the second substrate 201 or the light-exposed region 204 are heated. Then, as illustrated in FIG. 2D, plural types of organic compounds included in the light-exposed region 204 fly upward and attaches to the first electrode 207, so that a second layer 210 including the plural types of organic compounds is selectively formed. Note that the first organic compound 203 and the second organic compound 213 are evaporated by heating, but since the light-exposed region 204 is polymerized, the other composition than the plural organic compounds, i.e., a high molecular material such as resin is left. As illustrated in FIG. 2D, since the amount of the organic compounds to fly upward is limited in advance, the layer including the plural organic compounds with a desired thickness can be formed in a desired region, without using a thickness monitor. The advantage for using a hot plate is as follows: since a hot plate does not use intense light, the hot plate is effective for organic compounds that may be reacted or changed in some manners due to intense light such as a flash lamp.

In FIG. 2D, the insulator 208 serving as a partition is provided to prevent short-circuiting between adjacent first electrodes, but this is not a limiting example and the insulator 208 is not necessarily provided. In addition, in FIG. 2D, the first substrate is disposed on the upper side and the second substrate is disposed on the lower side, but this is not a limiting example, and it is also possible that the substrates are arranged vertically and face each other.

Further, it is also possible that a plurality of plates serving as second substrates are prepared, different material layers formed on the plates, the above deposition procedure is repeated to selectively form a stacked layer.

In a conventional technique, when co-deposition is conducted, plural organic compounds are prepared in separate crucibles, the crucibles are disposed such that the directions of openings of the crucibles are adjusted to mix evaporated materials, heating temperatures of the crucibles are controlled separately, and evaporation rates thereof are adjusted with a film thickness monitor, and after the rates become stable, deposition is conducted. Accordingly, setting conditions is complicated and takes time, and thus it is difficult to automatically conduct co-deposition in a short time.

In the deposition method of the present invention, a material liquid including a plurality of organic compounds having a adjusted mixture ratio is prepared in advance, the material liquid is applied on the second substrate which is flat by a coating method, and then a organic compound film is formed over the first electrode provided on the first substrate using the second substrate applied with the material liquid. Thus, co-deposition can be conducted without using the thickness monitor, and a uniform thickness can be obtained. Accordingly, co-deposition can be automatically conducted in a short time.

Next, a second electrode is formed to be opposed to the first electrode, thereby forming a light-emitting element. The light-emitting element includes at least the first electrode, the layer including plural types of organic compounds, and the second electrode, and the layer including plural types of organic compounds is disposed between the first electrode and the second electrode.

In this embodiment mode, the example of using a hot plate having a larger area than the second substrate is described, but this is not a limiting example and a flash lamp can be used. In addition, when a substrate having electric conductivity (e.g., a tungsten substrate or a copper substrate) as the second substrate, the second substrate can be used as a heat source and electric current is directly supplied to the substrate for heating.

This embodiment mode can be freely combined with Embodiment Mode 1.

(Embodiment Mode 3)

Embodiment Mode 3 will describe an example in which an organic compound in a region which is not exposed to light is deposited, although the example in which the organic compound included in the light-exposed region is deposited is described in Embodiment Mode 1.

A first substrate 306 and a second substrate 301 are prepared first. The first substrate 306 is a substrate to be provided with a light-emitting element, and the second substrate 301 is a substrate used for forming a second layer including an organic compound over the first substrate 306. As the second substrate 301, a substrate having electric conductivity is used. As the substrate having electric conductivity, a substrate itself may be formed of a conductive material or may be an insulating substrate having a conductive film on its surface.

Figure 3A:
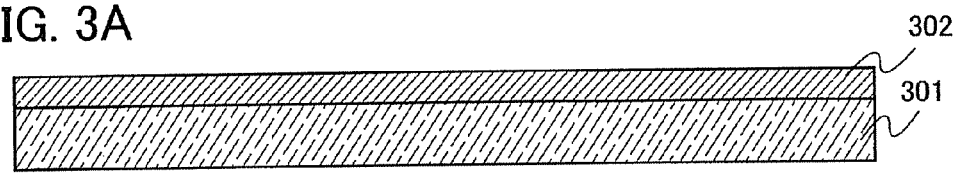
FIGS. 3A to 3D are cross-sectional views illustrating a manufacturing method of a light-emitting device described in Embodiment Mode 3

On the second substrate 301, an application liquid, i.e., a liquid in which a monomer to be photopolymerized is dissolved or dispersed in a solvent, is applied by a wet process, e.g., a spin coating method, a spray coating method, a dip coating method or the like. The thickness and uniformity of the second layer to be formed over the first substrate 306 in a later step depends on the adjustment of this application liquid. Therefore, it is important that the monomer to be photopolymerized is evenly dissolved in the application liquid, or is evenly dispersed in the application liquid. In addition, when a spin coating method is employed, the thickness of a film formed can be controlled by the viscosity of the application liquid, the number of rotation of the substrate, or the like. Note that the first layer 302 including a monomer to be photopolymerized includes a composition such as a photopolymerization initiator. FIG. 3A is a schematic view of a cross-sectional view of the second substrate 301 at this stage.

As the solvent, a polar solvent or a non-polar solvent described in Embodiment Mode 1 is used.

The monomer to be photopolymerized may be selected from light-emitting substances shown below as appropriate depending on a solvent to be used. For example, monomers having an unsaturated double bond group e.g., a vinyl group (C=C—) such as N-vinylcarbazole or 9,9'-dimethyl-2-vinylfluorene, an acroyl group (C=C—COO—), or an allyl group (C=C—C—) may be used as the light-emitting substance. In addition, as the photopolymerization initiator, for example, 2-chlorothiochitosan or benzophenone, a ketone based photopolymerization initiator such as Michler's ketone, an acetophenone based polymerization initiator such as diethoxyacetophenone or 2-hydroxy-2-methyl-1-phenyl-propane-1-one, benzyl or the like may be used.

Next, selective light exposure is conducted with a light-exposure apparatus. In this embodiment mode, a light-exposure mask for blocking light in a region to be evaporated is used so as to evaporate the region which is not exposed to light, unlike Embodiment Mode 1.

Figure 3B:
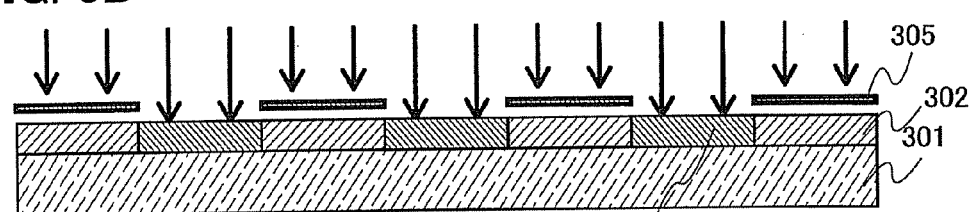

FIG. 3B illustrates a mode in which light exposure is conducted using a light-exposure mask 205. By using the light-exposure mask, a region having a desired shape can be selectively exposed to light. In the light-exposed 303, a polymerization reaction occurs such that the monomer is changed into a polymer. Although FIG. 3B illustrates the example in which light exposure is conducted at the side in which the first layer 302 including a monomer to be polymerized is exposed, that is, at the surface, this is not a limiting example. If the second substrate has a light-transmitting property, a light-exposure mask may be provided on the back of the second substrate, and light exposure may be conducted at the back of the second substrate.

Next, the first substrate 306 and the second substrate 301 are disposed so as to face each other, the distance d between the substrates is fixed and the positions of the substrates are adjusted. In advance, over the first substrate 306, a first electrode 307 and an insulator 308 for preventing short-circuiting between adjacent first electrodes are provided. In addition, the distance d between the substrates is from 0 mm to 30 mm, inclusive.

Figure 3C:
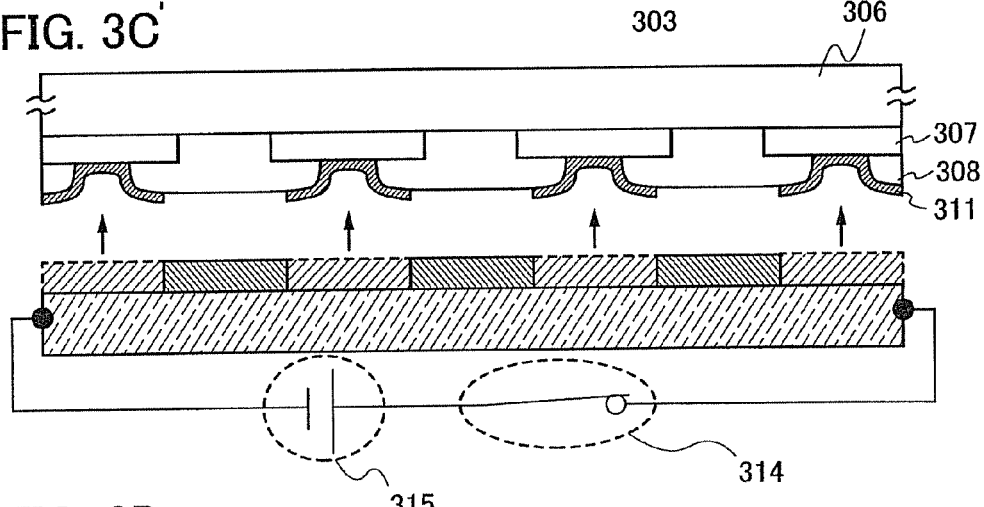
Figure 3D:
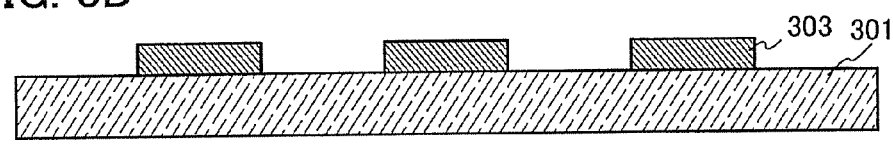

Next, electric current is supplied to the second substrate 301 under reduced pressure so that the second substrate 301 or an unexposed region (a region which is not exposed to light) 304 is heated. Note that current supply to the second substrate is conducted using a power source 315 electrically connecting the opposite ends of the second substrate and is controlled by a switch 314. Then, as illustrated in FIG. 3C, the monomer included in the light-exposed region 303 flies upward and attaches to the first electrode 307, so that a second layer 311 is selectively formed. Note that the monomer of the unexposed region is evaporated, but since the light-exposed region 303 is polymerized to be a polymer, the light-exposed region 303 is left. FIG. 3D illustrates a mode of the second substrate 301 after evaporation. An advantage of current supply to the second substrate is that irradiation with intense light is not conducted, and thus this method is effective for the case of using an organic compound which may be reacted or changed in its quality due to intense light of a flash lamp or the like.

In this embodiment mode, light exposure is conducted but development is not conducted. Therefore, the number of steps can be more reduced than that of Embodiment Mode 1. Further, when an organic material which is weak to moisture included in a developer or the like is desired to be used, this embodiment mode is more suitable than Embodiment Mode 1.

This embodiment mode can be optionally combined with Embodiment Mode 1. For example, after a hole-transporting layer of a light-emitting element is selectively formed according to Embodiment Mode 1, a light-emitting layer of the light-emitting element is selectively formed according to this embodiment mode, thereby forming a stacked structure of the hole-transporting layer and the light-emitting layer.

Figure 4:
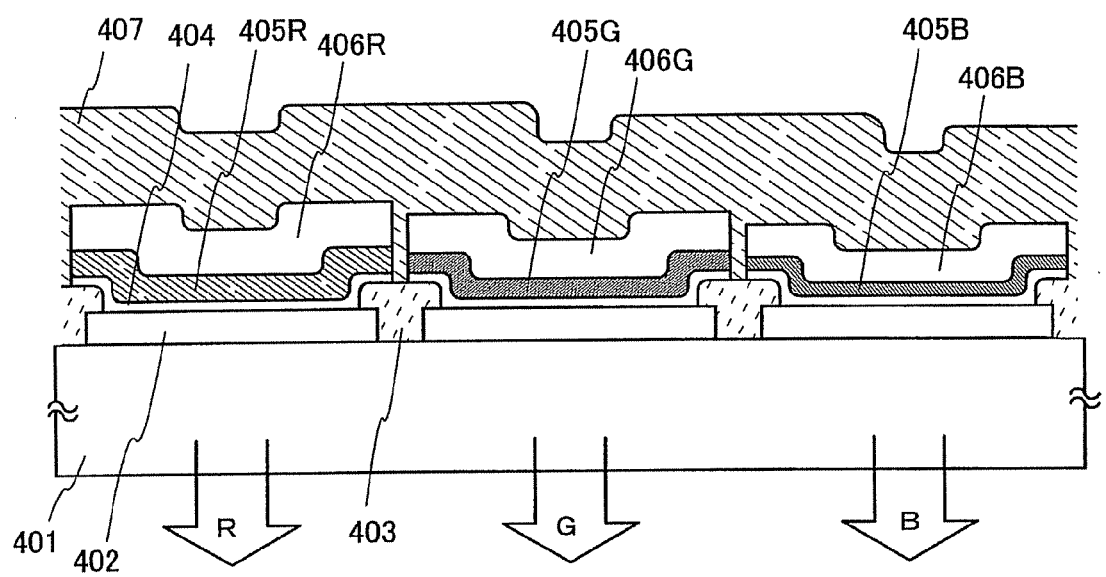
FIG. 4 is a cross-sectional view of a light-emitting element.

FIG. 4 illustrates a structure of a light-emitting device for full-color display as an example, and an example of manufacturing the light-emitting device is described below.

An example of full-color display using three types of light-emitting elements, i.e., a light-emitting element for red emission, a light-emitting element for blue emission and a light-emitting element for green emission is shown in the drawing. Further, a light-emitting element for another color emission, other than red, green and blue, and light-emitting element(s) for white, cyan, magenta, umber, orange and/or yellow may be combined to display an image. For example, full-color display may be conducted with driving using four light-emitting elements for four colors, RGBW.

Over an insulating substrate 401 having a light-emitting property, a switching element, a first electrode 402 electrically connected to the switching element, and an insulator 403 for preventing short-circuiting between adjacent first electrodes are formed. The first electrode 402 serves as a cathode or an anode of each light-emitting element, and is formed of a light-transmitting conductive material. Note that the switching element is not shown in the drawing, but FIG. 4 illustrates an example of an active driving type light-emitting device.

A first plate is prepared, for which a material layer for forming a hole-injecting layer has been provided in advance. The material layer is formed on the first plate by a spin coating method and is selectively exposed to light.

Next, a face of the insulating substrate 401 on which the first electrode 402 is formed and the face of the plate on which the material layer is formed are made to face each other and their positions are adjusted, and by heating the first plate, a first material layer 404 is formed on the first electrode 402. The first material layers 404 having the same thickness are formed in the respective light-emitting elements.

In addition, a second plate in which a material layer for forming a light-emitting layer of a light-emitting element for red emission has been provided, a third plate in which a material layer for forming a light-emitting layer of a light-emitting element for green emission has been provided, and a fourth plate in which a material layer for forming a light-emitting layer of a light-emitting element for blue emission has been provided are prepared in advance. Note that the second plate, the third plate and the fourth plate are provided respectively with material layers for different emission colors by a spin coating method, and then light exposure is selectively conducted using masks which are different for each color.

Next, the face of the substrate on which the first material layer 404 is formed and the second plate provided with the material layer including a light-emitting material for red emission are made to face each other and their positions thereof are adjusted. Then, the second plate is heated to selectively form a light-emitting layer 405R for red emission on the first material layer 404.

Next, the face of the substrate on which the first material layer 404 is formed and the third plate provided with the material layer including a light-emitting material for green emission are made to face each other and their positions thereof are adjusted. Then, the third plate is heated to selectively form a light-emitting layer 405G for green emission on the first material layer 404.

Then, the face of the substrate on which the first material layer 404 is formed and the fourth plate provided with the material layer including a light-emitting material for blue emission are made to face each other and their positions thereof are adjusted. Then, the fourth plate is heated to selectively form a light-emitting layer 405B for blue emission on the first material layer 404.

The formation order of the light-emitting layer 405R for red emission, the light-emitting layer 405G for green emission, and the light-emitting layer 405B for blue emission is not restricted to the above described formation order, and any of the layers may be formed first.

Further, a fifth plate is prepared in advance, for which a material layer for forming an electron-injecting layer has been provided. Then, the sixth plate and the seventh plate having different thicknesses of material layers for forming an electron-injecting layer, are prepared. In addition, note that after material layers having different thicknesses are formed on the fifth plate, the sixth plate and the seventh plate by a spin coating method, light exposure is selectively conducted using a mask.

Then, the face of the substrate on which the light-emitting layer 405R for red emission is formed and the fifth plate provided with the material layer for forming an electron-injecting layer are made to face each other and the positions thereof are adjusted. Then, the fifth plate is heated to form a second material layer 406R on the light-emitting layer 405R for red emission.

Then, the face of the substrate on which the light-emitting layer 405G for green emission is formed and the sixth plate provided with the material layer for forming an electron-injecting layer are made to face each other and the positions thereof are adjusted. Then, the sixth plate is heated to form a third material layer 406G on the light-emitting layer 405G for green emission.

Then, the face of the substrate on which the light-emitting layer 405B for blue emission is formed and the seventh plate provided with the material layer for forming an electron-injecting layer are made to face each other and the positions thereof are adjusted. Then, the seventh plate is heated to form a fourth material layer 406B on the light-emitting layer 405B for blue emission.

The formation order of the second material layer 406R of the light-emitting element for red emission, the third material layer 406G of the light-emitting element for green emission, and the fourth material layer 406B of the light-emitting element for blue emission is not restricted to the above described formation order, and any of the layers may be formed first.

Next, a second electrode 407 is formed by an electron beam evaporation method. The second electrode 407 is formed using aluminum or silver or an alloy thereof.

Through the above steps, a full-color display device can be manufactured.

A deposition method using a plate on which a material layer exposed to light using a mask is formed makes it possible to deposit a film with high positional accuracy and to almost align end portions of the material layers. In FIG. 4, the end faces of the first material layer, the light-emitting layer for red emission and the second material layer are almost aligned. In addition, the end faces of the first material layer, the light-emitting layer for green emission and the third material layer are almost aligned. Further, the end faces of the first material layer, the light-emitting layer for blue emission and the fourth material layer are almost aligned. In the deposition method using a plate on which a material layer exposed to light using a mask is formed in advance, light-emitting elements are selectively formed in a display portion having a matrix structure and they are not formed at a terminal portion to an external terminal.

In addition, as illustrated in FIG. 4, the distance between the electrodes, i.e., the thickness of a stacked layer of the layer including an organic compound is changed to adjust emission efficiency for each emission color.

For example, in the case of the light-emitting element for green emission, the light path length is set such that an interference of light is caused between a pair of electrodes, and light at a wavelength of color green is reinforced by a resonance produced at this time. Mainly the thicknesses of the second material layer 405G and the second material layer 406G are adjusted so that the light path length is set to weaken light at wavelengths other than the wavelength of color green.

Similarly, in the case of the light-emitting element for red emission, the light path length is set such that an interference of light is caused between a pair of electrodes, and light at a wavelength of color red is reinforced by a resonance produced at this time. Mainly the thicknesses of the second material layer 405R and the second material layer 406R are adjusted so that the light path length is set to weaken light at wavelengths other than the wavelength of color red.

Similarly, in the case of the light-emitting element for blue emission, the light path length is set such that an interference of light is caused between a pair of electrodes, and light at a wavelength of color blue is reinforced by a resonance produced at this time. Mainly the thicknesses of the second material layer 405B and the second material layer 406B are adjusted so that the light path length is set to weaken light at wavelengths other than the wavelength of color blue.

If light exposure using an attenuated phase shift mask is used, the second material layer, the third material layer and the fourth material layer having different thicknesses can be formed using one plate, i.e., in one deposition step.

When the first electrode 402 has a light-transmitting property and the second electrode 407 has a light-reflecting property, light is emitted in the direction of the arrow illustrated in FIG. 4. Alternatively, it is also possible that when the first electrode 402 has a light-reflecting property and the second electrode 407 has a light-transmitting property, light may be emitted in the opposite direction to the direction of the arrow illustrated in FIG. 4. Alternatively, it is also possible that when the first electrode 402 and the second electrode 407 both have a light-transmitting property, light is emitted from the opposite sides.

Pixels can be arranged in various ways, which is another advantage of the active driving. Although the example of a mosaic-type in which pixels are sequentially arranged in a column direction or a row direction, a delta-type in which pixel units are arranged in zigzags in a column direction, or a stripe-type in which light-emitting elements of the same color are arranged on a pixel-column basis may be made.

Although FIG. 4 shows the example of the active matrix drive type light-emitting device, there is no particular limitation, and a passive matrix drive type light-emitting device may be employed. In the case of the passive matrix drive type light-emitting device, it is preferable that the second electrode 407 is separated for each emission color and a plurality of wirings are provided.

In addition, deposition with high positional alignment is possible, and the interval between adjacent layers for different colors can be made smaller. High definition full-color display can be realized. Further, the area of the insulator serving as a partition can be made smaller. In addition, if not necessary, a structure without the insulator provided can be realized.

This embodiment mode can be freely combined with Embodiment Mode 1 or Embodiment Mode 2.

The present invention including the above-described structures will be described in detail in Embodiments given below.
(Embodiments)
(Embodiment 1)

Figure 5:
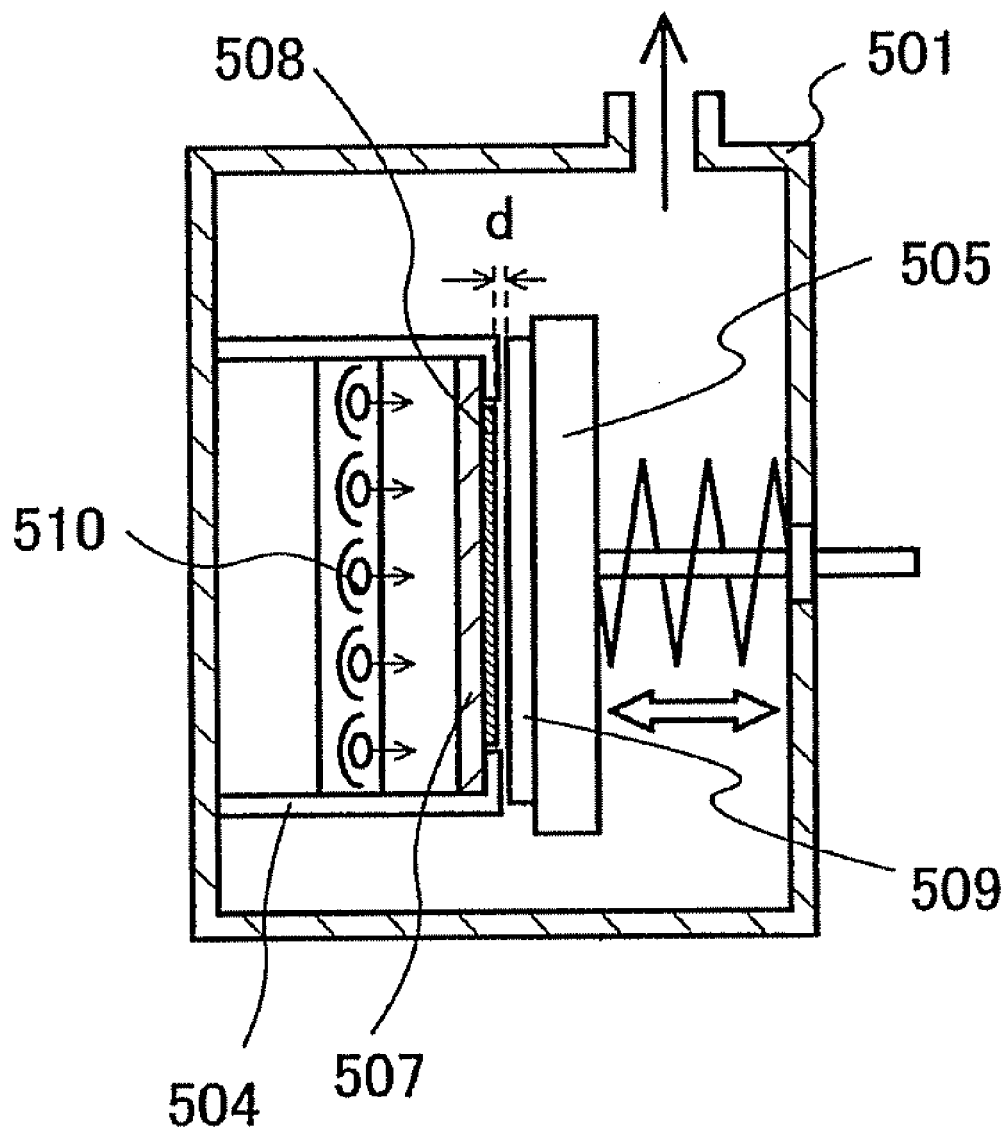
FIG. 5 is a cross-sectional view of a deposition apparatus.

Embodiment 1 will describe an example of a deposition apparatus employing vertical placement of a substrate, which is illustrated in FIG. 5.

In FIG. 5, a deposition chamber 501 is a vacuum chamber. In the deposition chamber 501, at least, a plate supporting unit which is a first substrate supporting means 504, a supporting mechanism of a film-formation substrate, which is a second substrate supporting means 505, and a lamp 510 as a heat source are included.

Although not illustrated, the deposition chamber 501 is connected to a first transfer chamber to transfer a film-formation substrate with the substrate vertically placed, and to a second transfer chamber to transfer a plate with the plate vertically placed. It is to be noted that, in this specification, "to be vertically placed" or "vertical placement" refers to placement of a substrate, in which a substrate surface makes a certain angle (70° to 100°) nearly perpendicular with respect to a horizontal surface. Because large-area glass substrates are easy to bend, such substrates are desirably transferred with the substrates vertically placed.

The lamp 510 is more suitable for the heat source than a heater, because heating using the lamp 510 in a short time is more suitable than a heater, for heating a large-area glass substrate, which easily shrinks due to heat.

As the procedure of film formation, first, in another deposition chamber, a material layer 508 is selectively formed on one surface of the plate that is a first substrate 507. The material layer 508 includes at least a photopolymerization initiator, a material to be polymerized with the photopolymerization initiator, and an organic compound. In the light-exposed region, a polymerization reaction occurs. The material layer 508 is formed by being subjected to selective light exposure using a light-exposure mask and development, and removing an unexposed region. To keep the first substrate support means 504 from coming in contact with the material layer 508, the material layer formed in an unnecessary potion in the vicinity of the substrate or at an end portion of the substrate may be removed by a liquid which can dissolve the material layer. Alternatively, the material layer formed in an unnecessary portion in the vicinity of the substrate or at an end portion of the substrate may be removed by oxygen plasma using a metal mask. In addition, if there is a concern that the material layer may be formed on the back side as well, the material layer formed on the back side is preferably removed.

Subsequently, the first substrate 507 is transferred from another deposition chamber to the deposition chamber 501 and set on the plate supporting mechanism. The first substrate 507 is fixed to the substrate supporting mechanism such that a surface of the first substrate 507 on which the material layer is formed, and a surface of the second substrate 509 on which the material layer 508 is to be formed (formation surface) face each other.

Subsequently, light is emitted from the lamp 510 to rapidly heat the plate while retaining the distance d (at this time, d is from 0 mm to 10 mm, inclusive) as illustrated in FIG. 5. In this embodiment, the distance d between the substrates is 0.05 mm. When the plate is rapidly heated, the material layer 508 on the plate is heated to be evaporated in a short time by heat conduction form the plate, and then the evaporated material is selectively deposited on the formation surface of the second substrate 507 that is disposed to face the material layer 508. FIG. 5 illustrates a mode in which the material layer 508 seems to be formed over the almost entire surface of the substrate; however, the material layer 508 is developed and partially removed.

Since the distance between the first substrate and the second substarate is as small as 0.05 mm, the same pattern as the shape of the top surface of the material layer 508 is selectively formed on a surface of the second substrate 507. The pattern is formed on the surface of the second substrate 507 with the same size and a position superposed with the material layer 508.

A plurality of deposition apparatuses illustrated in FIG. 5 can be disposed in series to form an in-line manufacturing apparatus. It is needless to say that a deposition apparatus for another film formation method can be combined.

A multichamber manufacturing apparatus can be obtained by providing a plurality of deposition apparatuses illustrated in FIG. 5. Needless to say, combination with a deposition apparatus using another formation method is also possible.

The deposition apparatus employing vertical placement of a substrate is not a limiting example, and a face-down system deposition apparatus or a face-up system deposition apparatus can also be employed.

The deposition apparatus used in the present invention is not limited to the structure of FIG. 5, and may be an apparatus in which the distance d between the second substrate and the material layer selectively formed on the first substrate is from 0 mm to 30 mm inclusive, and the first substrate can be heated. Further, a tape film may be used, without being limited to plates.

This embodiment can be freely combined with any of Embodiment Modes 1 to 3.

(Embodiment 2)

In Embodiment 2, an example will be described in which a passive matrix light-emitting device is formed on a glass substrate with reference to FIGS. 6A to 6C, FIG. 7, and FIG. 8.

In a passive matrix (simple-matrix) light-emitting device, a plurality of anodes arranged in stripes (stripe-form) are provided perpendicularly to a plurality of cathodes arranged in stripes. A light-emitting layer or a fluorescent layer is interposed at each intersection. Therefore, a pixel at an intersection of an anode selected (an electrode to which a voltage is applied) and a cathode selected emits light.

Figure 6A:
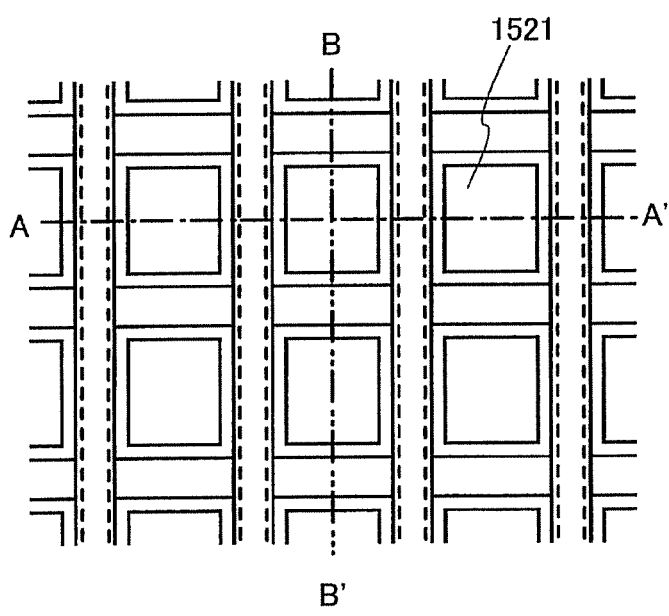
FIGS. 6A to 6C are a top view and cross-sectional views of a passive matrix light-emitting device.
Figure 6C:
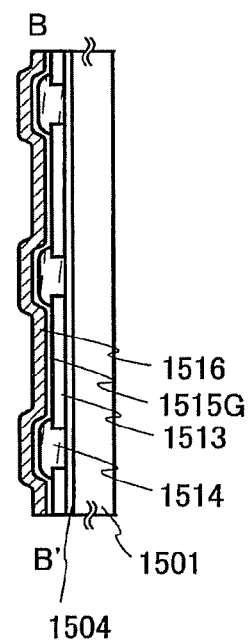
Figure 6B:
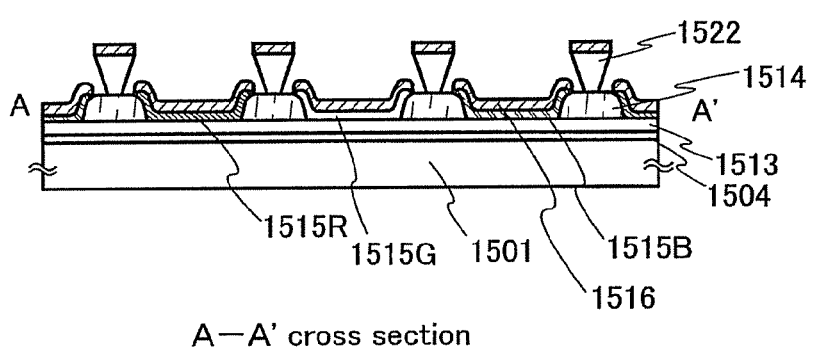

FIG. 6A is a top view of a pixel portion before sealing. FIG. 6B is a cross-sectional view taken along the dashed line A-A' in FIG. 6A. FIG. 6C is a cross-sectional view taken along the dashed line B-B' in FIG. 6A.

An insulating film 1504 is formed over a first substrate 1501 as a base film. It is to be noted that the base film need not be formed if not necessary. A plurality of first electrodes 158 are arranged in stripes at regular intervals over the insulating film 1504. A partition 1514 having openings each corresponding to a pixel is provided over the first electrodes 158. The partition 1514 having openings is formed using an insulating material (a photosensitive or nonphotosensitive organic material (polyimide, acrylic, polyamide, polyimide amide, resist, or benzocyclobutene) or an SOG film (such as an $SiO_x$ film containing an alkyl group)). It is to be noted that openings each corresponding to a pixel becomes light-emitting regions 1521.

A plurality of inversely tapered partitions 1522 which are parallel to each other and intersect with the first electrodes 1513 are provided on the partition 1514 having openings. The inversely tapered partitions 1522 are formed by photolithography using a positive-type photosensitive resin of which a portion unexposed to light remains as a pattern, and by adjusting the amount of light exposure or the length of development time so that a lower portion of a pattern is etched more than an upper portion of the pattern to form the inversely tapered shapes.

Figure 7:
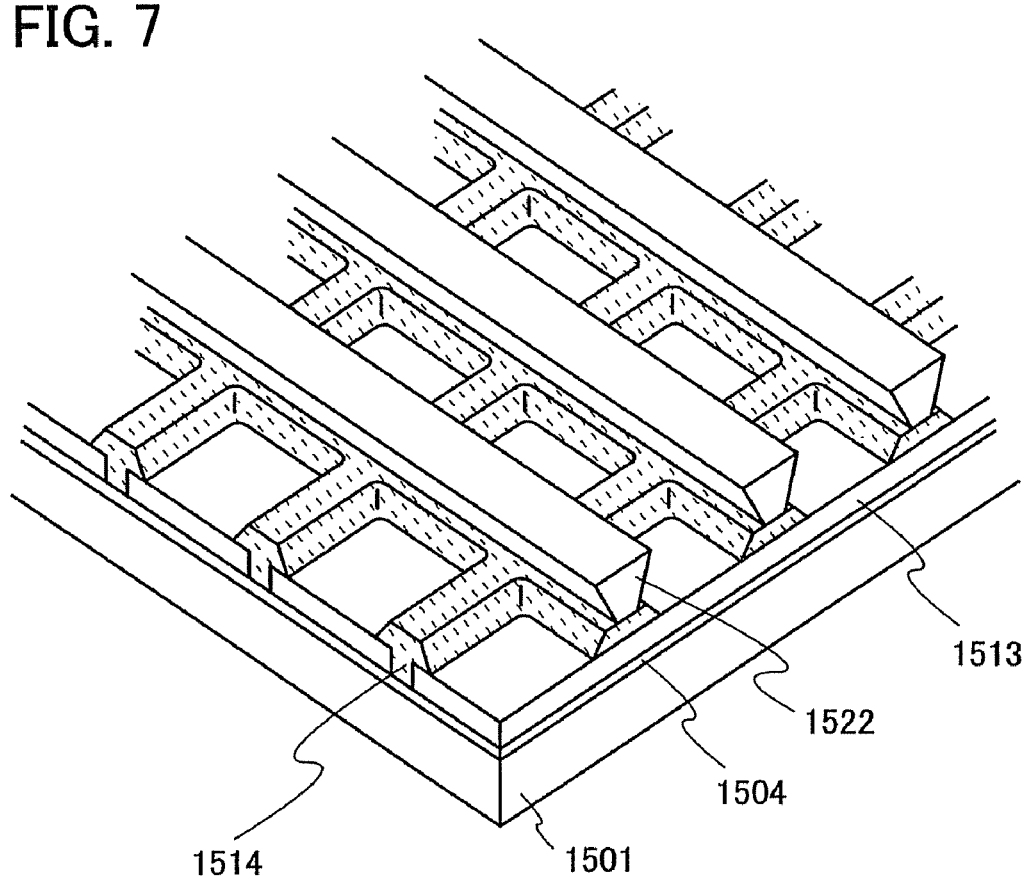
FIG. 7 is a perspective view of a passive matrix light-emitting device.

FIG. 7 is a perspective view immediately after formation of the plurality of inversely tapered partitions 1522 which are parallel to each other. It is to be noted that the same reference numerals are used to denote the same portions as those in FIGS. 6A to 6C.

The thickness of each of the inversely tapered partitions 1522 is set to be larger than the total thickness of a stacked film including a light-emitting layer, and a conductive film. When a conductive film and a stacked film including a light-emitting layer are stacked over the first substrate having the structure illustrated in FIG. 7, they are separated into a plurality of regions that are electrically isolated from each other, so that stacked films 1515R, 1515G, and 1515B each including a light-emitting layer, and second electrodes 1516 are formed as illustrated in FIGS. 6A to 6C. The second electrodes 1516 are electrodes in stripe form that are parallel to each other and extend in the direction intersecting with the first electrodes 158. Note that selective deposition can be conducted such that the light-emitting layer is not formed over the inversely tapered partition 1522, according to the deposition method of present invention. Further, even if the size of the shape of the top surface of the partition becomes smaller, selective deposition with the accuracy of the positional alignment can be conducted. The interval between adjacent light-emitting regions can be made smaller. In addition, a conductive film is formed over the inversely tapered partition 1522, however, the conductive film is electrically insulated from the second electrode 1516.

Here, is described an example in which the stacked films 1515R, 1515G, and 1515B each including a light-emitting layer are selectively formed to form a light-emitting device capable of performing full color display, from which three kinds of light emission (R, G, and B) can be obtained. The stacked films 1515R, 1515G, and 1515B each including a light-emitting layer are formed into a pattern of stripes parallel to each other.

In this embodiment, stacked films each including a light-emitting layer are sequentially formed by using the deposition apparatus described in Embodiment 1. A first plate including a light-emitting layer which emits red light, a second plate including a light-emitting layer which emits green light, and a third plate including a light-emitting layer which emits blue light are each prepared to be transferred to the deposition apparatus described in Embodiment 1. Then, a substrate provided with the first electrode 1513 is also transferred to the deposition chamber. Then, a surface of the first plate having the same area as or larger area than the substrate is heated to conduct deposition. Then, selective depositions are conducted by using the second plate and the third plate as appropriate.

Alternatively, stacked films each including a light-emitting layer which emits light of the same color may be formed over the entire surface to provide monochromatic light-emitting elements, so that a light-emitting device capable of performing monochromatic display or a light-emitting device capable of performing area color display may be provided. In this case, the material layer formed on the plate is subjected to light exposure and development to selectively form a stacked film including a light-emitting layer in a pixel portion, so as not to deposit a film in a terminal portion. Still alternatively, a light-emitting device capable of performing full color display may be provided by combining a light-emitting device which provides white light emission with color filters.

Further, sealing is performed using a sealant such as a sealant can or a glass substrate for sealing, if necessary. Here, a glass substrate is used as the second substrate, and the first substrate and the second substrate are attached to each other so that a space surrounded by the adhesive material such as the sealing material is sealed. The space that is sealed is filled with a filler or a dried inert gas. Moreover, a space between the first substrate and the filler may be filled and sealed with a desiccant agent in order to improve reliability of the light-emitting device. The desiccant agent removes a minute amount of moisture for sufficient desiccation. For the desiccant agent, a substance that adsorbs moisture by chemical adsorption such as oxide of alkaline earth metal such as calcium oxide or barium oxide can be used. As another desiccant agent, a substance that adsorbs moisture by physical adsorption such as zeolite or silicagel may be used.

The desiccant agent is not necessarily provided if the sealant that covers and is contact with the light-emitting element is provided to sufficiently block the outside air.

Figure 8:
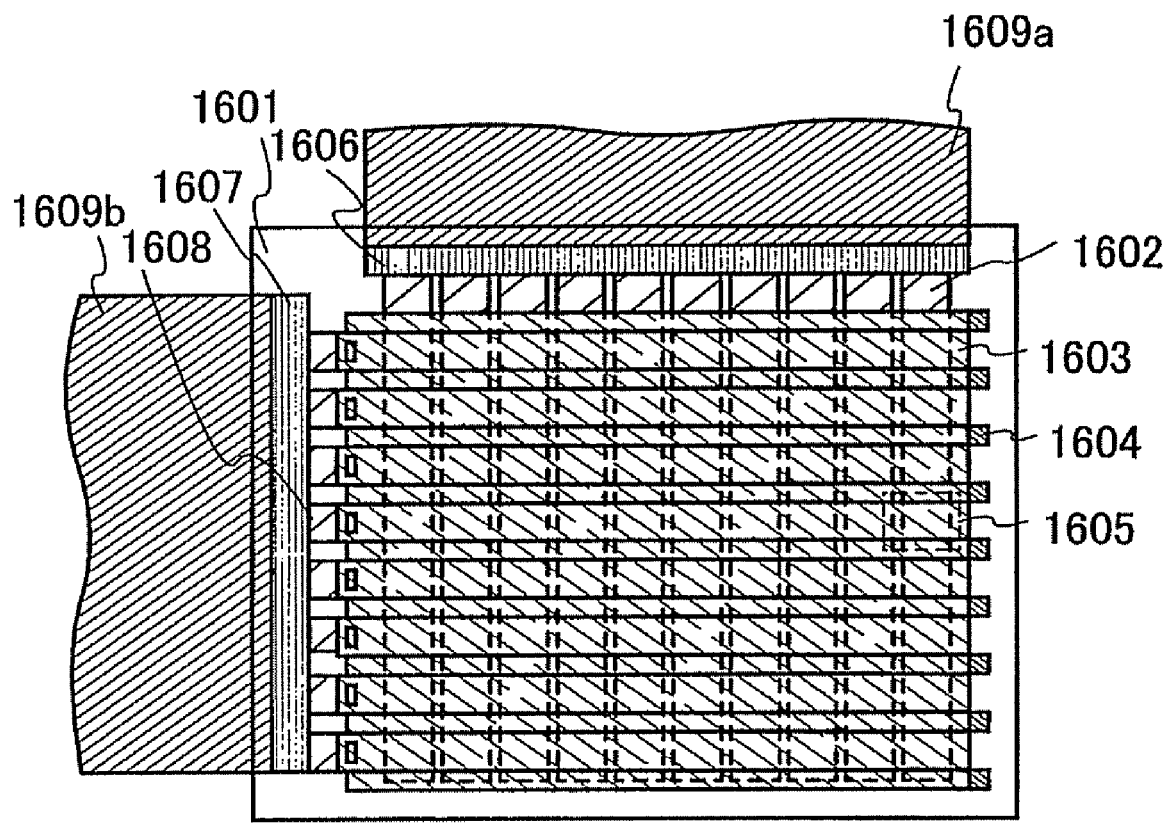
FIG. 8 is a top view of a passive matrix light-emitting device.

Next, FIG. 8 is a top view of a light-emitting module mounted with an FPC or the like.

It is to be noted that the "light-emitting device" in this specification refers to an image display device, a light-emitting device, or a light source (including a lighting device). Further, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted on a light-emitting device by a chip on glass (COG) method.

In a pixel portion for displaying images, scanning lines and data lines intersect with each other perpendicularly as illustrated in FIG. 8.

The first electrodes 1513 in FIGS. 6A to 6C correspond to scanning lines 1603 in FIG. 6, the second electrodes 1516 correspond to data lines 1602, and the inversely tapered partitions 1522 correspond to partitions 1604. Light-emitting layers are interposed between the data lines 1602 and the scanning lines 1603, and an intersection portion indicated by a region 1605 corresponds to one pixel.

It is to be noted that the scanning lines 1603 are electrically connected at their ends to connection wirings 1608, and the connection wirings 1608 are connected to an FPC 1609*b* through an input terminals 1607. The data lines 1602 are connected to an FPC 1609*a* through an input terminal 1606.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, a polarizing plate or a circularly polarizing plate may be provided with an anti-reflection film. For example, anti-glare treatment may be carried out by which reflected light can be diffused by projections and depressions on a surface so as to reduce reflection.

Through the above-described process, a flexible passive matrix light-emitting device can be manufactured. According to a manufacturing method of the present invention, the interval between light-emitting layers can be made small and thus, a light-emitting device which enables high resolution display can be formed.

Although FIG. 8 illustrates an example in which a driver circuit is not provided over a substrate, an IC chip including a driver circuit may be mounted as described below.

When the IC chip may be mounted, a data line side IC and a scanning line side IC, in each of which the driver circuit for transmitting a signal to a pixel portion is formed, are mounted on the periphery of (outside) the pixel portion by a COG method. The mounting may be performed using a TCP or a wire bonding method other than the COG method. The TCP is a TAB tape mounted with the IC, and the TAB tape is connected to a wiring over an element formation substrate to mount the IC. Each of the data line side IC and the scanning line side IC may be formed using a silicon substrate. Alternatively, it may be formed in such a manner that a driver circuit is formed using a TFT over a glass substrate, a quartz substrate, or a plastic substrate. Although described here is an example in which one IC is provided on one side, a plurality of ICs may be provided on one side.

This embodiment can be freely combined with any of Embodiment Modes 1 to 3 and Embodiment 1.

(Embodiment 3)

Figure 9A:
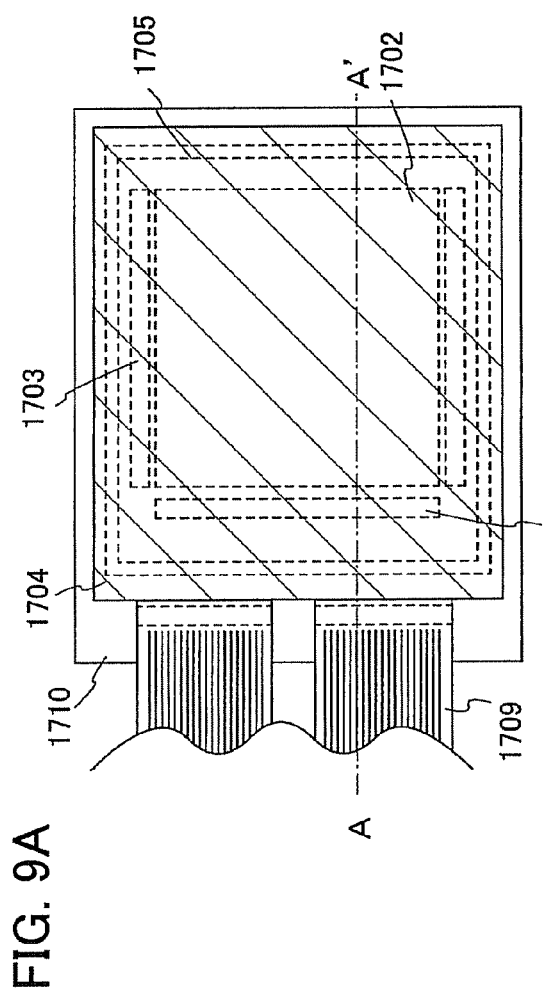
FIGS. 9A and 9B are views illustrating an active matrix light-emitting device.
Figure 9B:
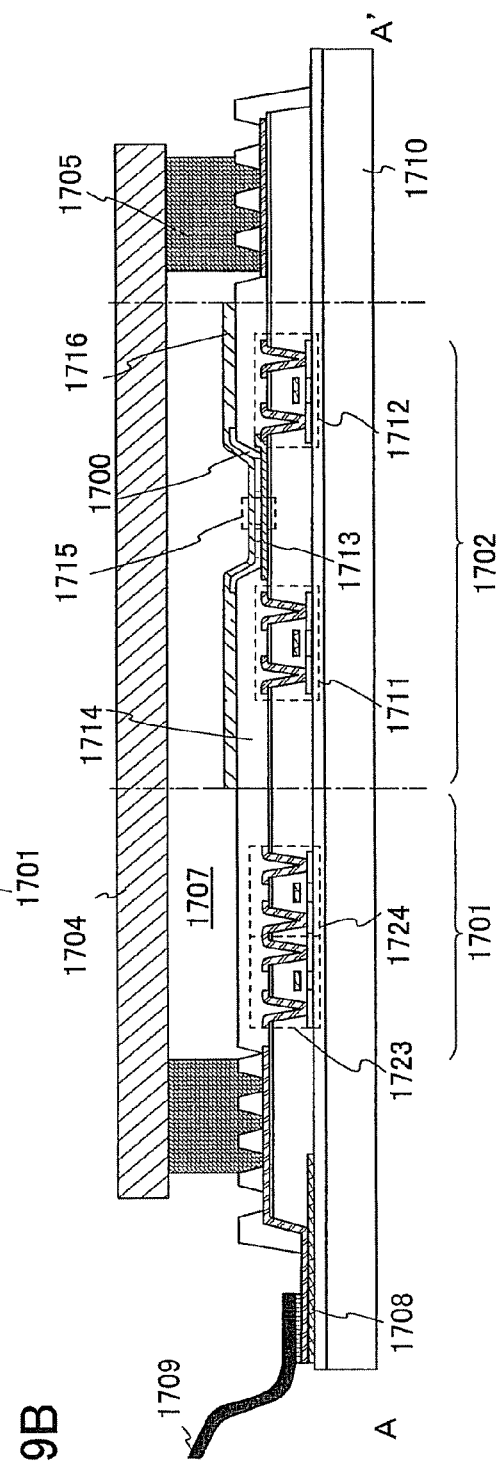

In this embodiment, a light-emitting device formed according to a manufacturing method of the present invention will be described with reference to FIGS. 9A and 9B. FIG. 9A is a top view illustrating a light-emitting device and FIG. 9B is a cross-sectional view taken along the line A-A'. A reference numeral 1701 indicated by a dotted line denotes a driver circuit portion (source side driver circuit); 1702 denotes a pixel portion; 1703 denotes a driver circuit portion (gate side driver circuit); 1704 denotes a sealing substrate; 1705 denotes a sealant, and 1707 denotes a space surrounded by the sealant 1705.

A reference numeral 1708 denotes a wiring for transmitting a signal inputted to the source side driver circuit 1701 and the gate side driver circuit 1703, and the wiring 1708 receives a video signal, a clock signal, a start signal, a reset signal, and the like from an flexible printed circuit (FPC) 1709 that is to be an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure will be described with reference to FIG. 9B. Although a driver circuit portion and a pixel portion are formed over an element substrate 1710, a pixel portion 1702 and a source side driver circuit 1701 that is a driver circuit portion are illustrated here.

As the source side driver circuit 1701, a CMOS circuit in which an n-channel TFT 1723 and a p-channel TFT 1724 are combined is formed. A circuit included in the driver circuit may be a known CMOS circuit, PMOS circuit, or NMOS circuit. In this embodiment, a driver-integrated type in which a driver circuit is formed over the same substrate is described; however, it is not necessary to have such a structure, and the driver circuit can be formed not over the substrate but outside the substrate.

The pixel portion 1702 is formed of a plurality of pixels each including a switching TFT 1711, a current control TFT 1712, and an anode 1713 that is electrically connected to a drain of the current control TFT 1712. An insulator 1714 is formed so as to cover an end portion of the anode 1713. Here, the insulator 1714 is formed using a positive type photosensitive acrylic resin film.

The insulator 1714 is formed so as to have a curved surface having curvature at an upper and lower end portions thereof in order to obtain favorable coverage. For example, when a positive type photosensitive acrylic is used as a material for the insulator 1714, a curved surface having a radius of curvature (0.2 to 3 µm) is desirably formed at the upper end portion of the insulator 1714. For the insulator 1714, either a negative type that becomes insoluble in an etchant by photosensitive light or a positive type that becomes soluble in an etchant by light can be used, and an inorganic compound such as silicon oxide or silicon oxynitride can be used as well as an organic compound.

A light-emitting element 1715 and a cathode 1716 are formed over the anode 1713. Here, as a material used for the anode 1713, a material having a high work function is desirable. For example, the following structures can be given: one-layer film of an indium tin oxide (ITO) film, an indium tin silicon oxide (ITSO) film, an indium zinc oxide (IZO) film, a titanium nitride film, a chromium film, a tungsten film, a zinc film, a platinum film, or the like; a stacked film of a titanium nitride film and a film containing aluminum as its main component; a stacked film having a three-layer structure of a titanium nitride film, a film containing aluminum as its main component, and a titanium nitride film; and the like. In a case where the anode 1713 is formed of the ITO film and a wiring of the current control TFT 1712 connected to the anode 1713 has a stacked structure of a titanium nitride film and a film containing aluminum as its main component or a stacked structure of a titanium nitride film, a film containing aluminum as its main component, and a titanium nitride film, resistance of the wiring is low, a favorable ohmic contact with an ITO film can be formed, and further the anode 1713 can be made to serve as an anode. The anode 1713 may be formed using the same material as a first anode in the light-emitting element 1715. Further, the anode 1713 may be stacked in contact with the first anode in the light-emitting element 1715.

The light-emitting element 1715 has a structure in which the anode 1713, a layer 1700 containing an organic compound, and the cathode 1716 are stacked; specifically, a hole-injecting layer, a hole-transporting layer, a light-emitting layer, an electron-transporting layer, an electron-injecting layer, and the like are stacked as appropriate. The light-emitting element 1715 is formed to have the element structure in FIG. 4 described in Embodiment Mode 2.

A material (aluminum, silver, lithium, calcium, or an alloy thereof: MgAg, MgIn, AlLi, calcium fluoride, or calcium nitride) having a low work function may be used as a material for the cathode 1716; however, the material for the cathode 1716 is not limited to the above and can employ a variety of conductive layers by selection of an appropriate electron-injecting material. When light emitted from the light-emitting element 1715 is made to be transmitted through the cathode 1716, for the cathode 1716, it is possible to use a stacked layer of a metal thin film with a reduced film thickness and a transparent conductive film of oxide indium tin oxide alloy (ITO), indium tin silicon oxide (ITSO), an indium oxide-zinc oxide alloy ($In_2O_3$—ZnO), zinc oxide (ZnO), or the like. The cathode 1716 may be formed using the same material as a second cathode in the light-emitting element 1715. Further, the cathode 1716 may be stacked in contact with the second cathode in the light-emitting element 1715. In addition, the cathode 1716 is electrically connected to an external input terminal.

Further, a structure is obtained in which the light-emitting element 1715 is provided in the space 1717 surrounded by the element substrate 1710, the sealing substrate 1704, and the sealant 1705 by attaching the sealing substrate 1704 to the element substrate 1710 by using the sealant 1705. The space 1707 may be filled not only with an inert gas (e.g., nitrogen or argon) but also with the sealant 1705.

An epoxy-based resin is preferably used for the sealant 1705. Such a material used is desirably a material which transmit moisture or oxygen as little as possible. As a material used for the sealing substrate 1704, a plastic substrate made of fiberglass-reinforced plastics (FRP), polyvinyl fluoride (PVF), polyester, acrylic, or the like can be used besides a glass substrate or a quartz substrate.

As necessary, a color conversion film such as a color filter may be provided.

As described above, a light-emitting device having a light-emitting element can be obtained. According to a manufacturing method of the present invention, a high resolution light-emitting display device can be realized.

This embodiment can be freely combined with any of Embodiment Modes 1 to 3 and Embodiment 1.

(Embodiment 4)

In this embodiment, with reference to FIGS. 10A to 10E and FIG. 11, explanation will be made on a wide variety of electronic devices manufactured using a light-emitting device including a light-emitting element formed according to a manufacturing method of the present invention.

Examples of the electronic devices formed according to the manufacturing method of the present invention include: televisions, cameras such as video cameras or digital cameras, goggle displays (head mount displays), navigation systems, audio reproducing devices (e.g., car audio component stereos and audio component stereos), laptop personal computers, game machines, portable information terminals (e.g., mobile computers, mobile phones, portable game machines, and electronic books), and image reproducing devices provided with recording media (specifically, the devices that can reproduce content of a recording medium such as a digital versatile disc (DVD) and is provided with a display device capable of displaying the reproduced images), lighting equipment, and the like. Specific examples of these electronic devices are illustrated in FIGS. 10A to 10E and FIG. 11.

Figure 10A:
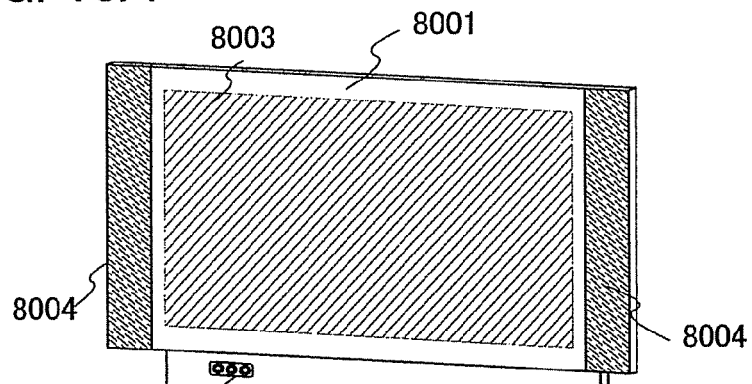
FIGS. 10A to 10E illustrate examples of electronic devices.

FIG. 10A illustrates a display device including a chassis 8001, a supporting base 8002, display portion 8003, a speaker portion 8004, a video input terminal 8005, and the like. The display device is manufactured by using a light-emitting device formed according to the present invention for the display portion 8003. It is to be noted that the display device includes all devices for displaying information, for example, for a personal computer, for receiving TV broadcasting, and for displaying an advertisement. According to the manufacturing method of the present invention, a display device which can conduct high definition display can be provided.

Figure 10B:
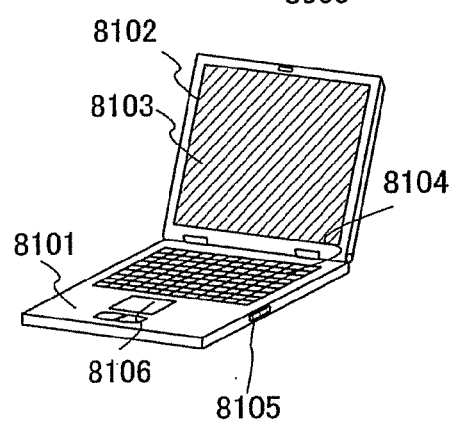

FIG. 10B illustrates a laptop personal computer including a main body 8101, a chassis 8102, a display portion 8103, a keyboard 8104, an external connection port 8105, a pointing device 8106, and the like. The laptop personal computer is manufactured by using a light-emitting device formed according to the manufacturing method of the present invention for the display portion 8103. According to the manufacturing method of the present invention, a light-emitting device which can conduct high definition display can be provided.

Figure 10C:
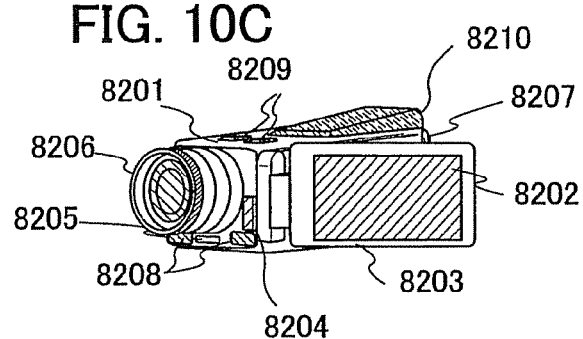

FIG. 10C illustrates a video camera including a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. The video camera is manufactured by using a light-emitting device formed according to the manufacturing method of the present invention for the display portion 8202. According to the manufacturing method of the present invention, a light-emitting device which can conduct high definition display can be provided.

Figure 10D:
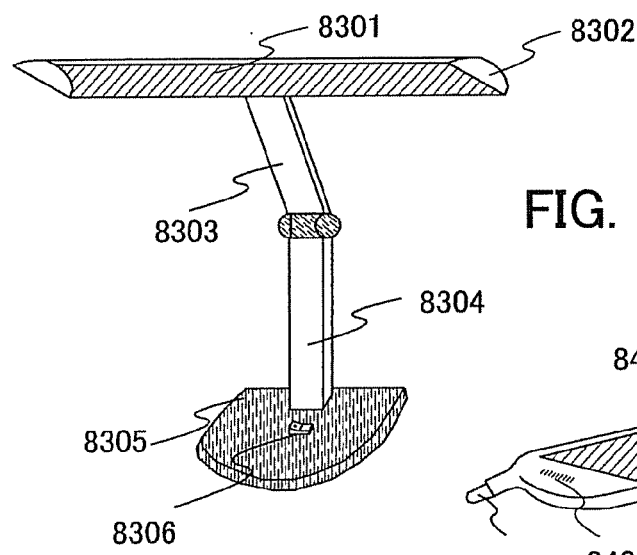

FIG. 10D illustrates a desk lamp including a lighting portion 8301, a shade 8302, an adjustable arm 8303, a support 8304, a base 8305, and a power supply 8306. The desk lamp is manufactured by using a light-emitting device formed according to the manufacturing method of the present invention for the lighting portion 8301. It is to be noted that the lighting equipment includes a ceiling light, a wall light, and the like. According to the manufacturing method of the present invention, the interval between adjacent light-emitting regions can be made small and the area of the light-emitting region per unit area can be expanded. Thus, lighting equipment with a large amount of light can be provided.

Figure 10E:
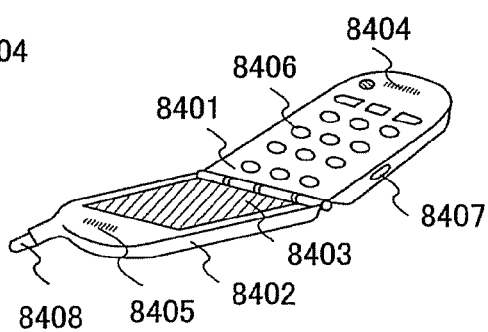

FIG. 10E illustrates a mobile phone including a main body 8401, a chassis 8402, a display portion 8403, an audio input portion 8404, an audio output portion 8405, operation keys 8406, an external connection port 8407, an antenna 8408, and the like. The mobile phone is manufactured by using a light-emitting device formed according to the manufacturing method of the present invention for the display portion 8403. According to the manufacturing method of the present invention, a mobile phone which can conduct high definition display can be provided.

Figure 11:
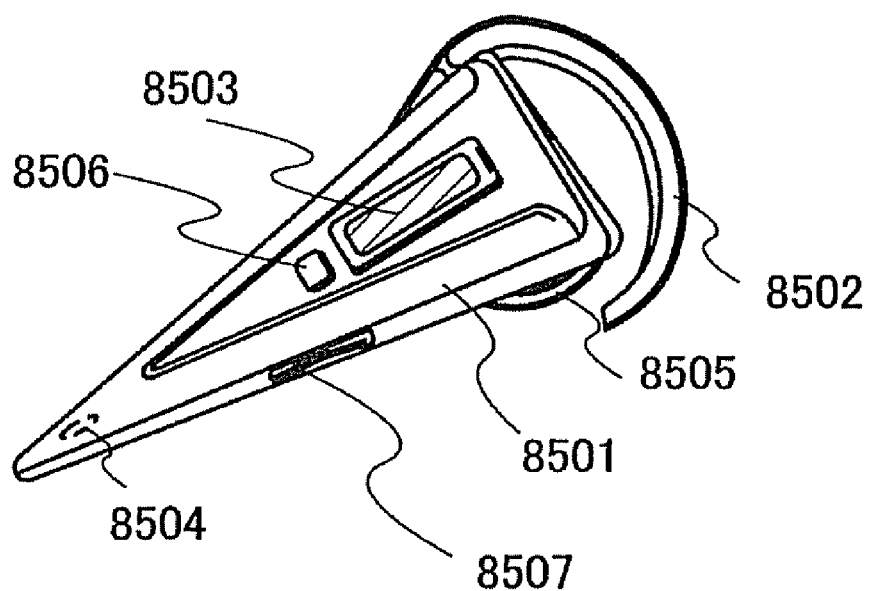
FIG. 11 illustrates an example of an electronic device.

FIG. 11 illustrates a headset, which can be used as a telephone receiver. The use of the headset enables communication without using a receiver and free the hands, and thus driving is possible while calling with the headset, for example. The headset includes a main body 8501, an ear pad 8502, a display portion 8503, an audio input portion 8504, an audio output portion 8505, an operation key 8506, an external connection port 8507 and the like. Note that if a wireless headset is used, an antenna which can communicate with a corresponding telephone is built in the main body 8501. In addition, a battery is built in the main body 8501. A light-emitting device having a light-emitting element formed by the manufacturing method of the present invention is applied to the display portion 8403, and the headset is manufactured. The headset which can conduct high definition display can be provided by the manufacturing method of the present invention.

In the above-described manner, an electronic device or lighting equipment using a light-emitting device formed according to the manufacturing method of present invention can be obtained. The applicable range of the light-emitting device formed according to the manufacturing method of the present invention is so wide that the light-emitting device can be applied to electronic devices in a variety of fields.

The light-emitting device described in this embodiment can be implemented in optional combination of any of the deposition methods in Embodiment Modes 1 to 3. In addition, the light-emitting device described in this embodiment can be implemented in optional combination of any of Embodiments 1 to 3.

This application is based on Japanese Patent Application Serial No. 2007-119084 filed with Japan Patent Office on Apr. 27, 2007, the entire contents of which are hereby incorporated by reference.

What is claimed is:

1. A manufacturing method of a light-emitting device, comprising the steps of:
    forming a first electrode on a first substrate;
    forming a first layer including a photopolymerization initiator, a material to be polymerized with the photopolymerization initiator, and an organic compound on a second substrate, wherein the second substrate is a metal substrate;
    selectively exposing the first layer to light so that the first layer is cured in a first region where the first layer is exposed to the light;
    developing the first layer to remove the first layer in a second region where the first layer is not exposed to the light;
    making a surface of the first substrate on which the first electrode is formed and a surface of the second substrate on which the first layer is formed face each other after exposing and developing the first layer;
    heating the cured first layer in the first region to evaporate the organic compound included in the first layer in the first region so that a second layer including the organic compound is selectively formed on the first electrode with the material to be polymerized left on the second substrate; and
    forming a second electrode on the second layer,
        wherein the heating step is performed by supplying a current with the second substrate directly.

2. The manufacturing method of a light-emitting device according to claim 1,
    wherein the organic compound is a low molecular light-emitting material.

3. The manufacturing method of a light-emitting device according to claim 1,
    wherein the light exposure of the first layer is conducted with an attenuated phase shift mask.

4. The manufacturing method of a light-emitting device according to claim 1,
    wherein the organic compound comprises substances that can emit light.

5. A manufacturing method of a light-emitting device, comprising the steps of:
    forming a first electrode on a first substrate;
    forming a first layer including a photopolymerization initiator, a material to be polymerized with the photopolymerization initiator, and a first organic compound and a second organic compound on a second substrate, wherein the second substrate is a metal substrate;
    selectively exposing the first layer to light so that the first layer is cured in a first region where the first layer is exposed to the light;
    developing the first layer to remove the first layer in a second region where the first layer is not exposed to the light;
    making a surface of the first substrate on which the first electrode is formed and a surface of the second substrate on which the first layer is formed face each other after exposing and developing the first layer;
    heating the cured first layer in the first region to evaporate the first organic compound and the second organic compound included in the first layer in the first region so that a second layer including the first organic compound and the second organic compound is selectively formed on the first electrode with the material to be polymerized left on the second substrate; and forming a second electrode on the second layer, wherein the heating step is performed by supplying a current with the second substrate directly.

6. The manufacturing method of a light-emitting device according to claim 5, wherein the first organic compound and the second organic compound are each a low molecular light-emitting material.

7. The manufacturing method of a light-emitting device according to claim 5, wherein the light exposure of the first layer is conducted with a light exposure apparatus using an attenuated phase shift mask.

8. The manufacturing method of a light-emitting device according to claim 5, wherein the second organic compound comprises substances that can emit light.

* * * * *